United States Patent [19]

Masia et al.

[11] Patent Number: 5,015,958

[45] Date of Patent: * May 14, 1991

[54] ELONGATE SENSORS COMPRISING CONDUCTIVE POLYMERS, AND METHODS AND APPARATUS USING SUCH SENSORS

[75] Inventors: Michael Masia, Redwood City; James P. Reed, San Francisco; Robert S. Wasley, San Carlos; Paul D. Hauptly, Fremont; Larry R. Reeder, San Jose; Peter L. Brooks, Los Altos; Thomas W. Tolles, San Francisco; Louis M. Frank, Sunnyvale; Mauro Bonomi, Palo Alto; Denis Wales, Fremont; Ray F. Stewart, Redwood City; John Lahlouh, Belmont; Laurence Welsh, Palo Alto, all of Calif.

[73] Assignee: Raychem Corporation, Menlo Park, Calif.

[*] Notice: The portion of the term of this patent subsequent to May 15, 2007 has been disclaimed.

[21] Appl. No.: 372,179

[22] Filed: Jun. 27, 1989

Related U.S. Application Data

[63] Continuation of Ser. No. 306,237, Feb. 2, 1989, abandoned, which is a continuation of Ser. No. 832,562, Feb. 20, 1986, abandoned, which is a continuation-in-part of Ser. No. 599,047, Apr. 11, 1984, abandoned, Ser. No. 556,740, Nov. 30, 1983, abandoned, Ser. No. 556,829, Dec. 1, 1983, abandoned, Ser. No. 618,109, Jun. 7, 1984, abandoned, Ser. No. 618,108, Jun. 7, 1984, abandoned, Ser. No. 603,484, Apr. 24, 1984, abandoned, Ser. No. 744,170, Jun. 12, 1985, abandoned, and Ser. No. 787,278, Oct. 15, 1985, abandoned, said Ser. No. 599,047, is a continuation-in-part of Ser. No. 509,897, Jun. 30, 1983, abandoned, said Ser. No. 556,829, is a continuation-in-part of Ser. No. 556,740, , said Ser. No. 618,108, is a continuation-in-part of Ser. No. 603,485, Apr. 24, 1984, abandoned, said Ser. No. 787,278, is a continuation-in-part of Ser. No. 744,170.

[51] Int. Cl.[5] .................. G01R 31/08; H01B 7/32
[52] U.S. Cl. ................... 324/522; 324/525; 324/526; 338/27; 174/11 R; 340/537
[58] Field of Search .................. 204/412, 418; 178/18-20; 340/605, 511, 537, 508, 510; 33/81 R; 323/353, 354; 73/304 C; 200/61.04, 193, 61.05, 61.25; 338/27, 214; 324/522, 525, 526, 514, 691; 174/116, 11 R

[56] References Cited

U.S. PATENT DOCUMENTS

| | | |
|---|---|---|
| 1,084,910 | 1/1914 | Stephenson . |
| 1,648,197 | 11/1927 | Roadhouse . |
| 1,772,232 | 8/1930 | Van Guilder . |
| 1,786,843 | 12/1930 | Hedeby ............................. 200/193 |

(List continued on next page.)

FOREIGN PATENT DOCUMENTS

| | | |
|---|---|---|
| 58704 | 4/1913 | Australia . |
| 719311 | 10/1965 | Canada ............................ 200/61.04 |
| 028142 | 5/1981 | European Pat. Off. . |
| 056283 | 1/1982 | European Pat. Off. . |
| 068767 | 1/1983 | European Pat. Off. . |
| 087307 | 8/1983 | European Pat. Off. . |

(List continued on next page.)

OTHER PUBLICATIONS

"WaterSentry LeakSentry Distributed Alarm and Locator Systems", Raychem Corporation, 1/1984.
Stubbings, "Electrical Review", 12/28/45, p. 947.
Dat Aquisition Handbook, 1982.

*Primary Examiner*—Reinhard J. Eisenzopf
*Assistant Examiner*—Jack B. Harvey
*Attorney, Agent, or Firm*—Timothy H. P. Richardson; Herbert G. Burkard

[57] ABSTRACT

Detection of events, e.g. liquid leaks and other changes in varibles. The event causes two conductors to become electrically connected, and thus creating a system in which the connection point can be located by measuring the potential drop from one end of one of the conductors (called the locating member) to the connection point. Preferably a fixed current flows through the connection, so that the result is independent of the resistance of the connection. The locating member can be a continuous resistive wire, preferably coated with a conductive polymer; such a locating member can form part of a sensor cable in which the elongate components of the circuit are in a wrapped configuration, or part of a cable in which the conductors are separated by a member shaped to prevent capillary action of a liquid from connecting the conductors. Alternatively the locating member comprises a plurality of discrete resistors. Preferably the system is arranged so that the sensitivity of the system is not dependent on the location of the fault and/or is such that only connections within a certain range of resistance will activate the system. The voltage drop is preferably calculated by comparing it to the voltage drop over a resistor of known size. Particular event-sensitive connection means are preferably employed for the detection of hydrocarbons and for the detection of acids.

28 Claims, 10 Drawing Sheets

U.S. PATENT DOCUMENTS

| | | | |
|---|---|---|---|
| 2,004,569 | 6/1935 | Davis, Jr. | 175/183 |
| 2,432,367 | 9/1943 | Andresen | 200/52 |
| 2,581,213 | 1/1952 | Spooner | 177/311 |
| 2,716,229 | 8/1955 | Wehrmann | 340/605 |
| 2,741,591 | 4/1956 | Dewey, II et al. | 204/180 |
| 2,759,175 | 8/1956 | Spalding | 340/242 |
| 2,790,146 | 4/1957 | Livingston | 324/140 |
| 2,841,765 | 7/1958 | Harrold | 324/62 |
| 2,879,471 | 3/1959 | Erath | 324/62 |
| 2,881,392 | 4/1959 | Heinz | 324/98 |
| 2,930,232 | 3/1960 | Spears | 73/304 R |
| 2,976,486 | 3/1961 | Gilbert | 324/64 |
| 3,033,916 | 6/1962 | Scofield | 174/117 |
| 3,098,116 | 7/1963 | Jore | 200/61.04 |
| 3,127,485 | 3/1964 | Vitolo | 200/61.05 |
| 3,200,388 | 8/1965 | Uhlig | 340/242 |
| 3,248,646 | 4/1966 | Brazee | 324/52 |
| 3,254,334 | 5/1966 | Mitchell | 340/514 |
| 3,304,612 | 2/1967 | Proctor | 178/18 |
| 3,365,661 | 1/1968 | Zimmerman | 324/52 |
| 3,382,493 | 5/1968 | Loper, Jr. et al. | 340/244 |
| 3,383,863 | 5/1968 | Berry | 61/1 |
| 3,427,414 | 2/1969 | Sheldahl | 200/61.04 |
| 3,465,109 | 9/1969 | Williams | 200/61.04 |
| 3,470,340 | 9/1969 | Hakka | 200/61.04 |
| 3,550,120 | 12/1970 | Kompelien | 340/409 |
| 3,564,526 | 2/1971 | Butts | 200/61.04 |
| 3,588,776 | 6/1971 | Horwinski | 340/508 |
| 3,600,674 | 8/1971 | Brea | 324/52 |
| 3,662,367 | 5/1972 | Deveau | 174/11 R |
| 3,702,473 | 11/1972 | Fink | 340/511 |
| 3,706,927 | 12/1972 | Jedvall | 324/52 |
| 3,721,898 | 3/1973 | Dragoumis et al. | 324/65 |
| 3,800,216 | 3/1974 | Hamilton | 324/52 |
| 3,800,217 | 3/1974 | Lowrence | 324/54 |
| 3,812,420 | 5/1974 | Gunter | 324/52 |
| 3,849,723 | 11/1974 | Allen | 324/446 |
| 3,852,995 | 12/1974 | Duncanson | 73/40 |
| 3,866,202 | 2/1975 | Reiss et al. | 340/274 |
| 3,875,331 | 4/1975 | Hasenbalg | 178/18 |
| 3,885,097 | 5/1975 | Pobgee | 178/18 |
| 3,981,181 | 12/1976 | Ochiai | 73/40.5 |
| 3,991,413 | 11/1976 | Berger | 340/537 |
| 4,013,924 | 3/1977 | Christensen | 174/11 R |
| 4,029,889 | 6/1977 | Mizuochi | 174/11 |
| 4,052,901 | 10/1977 | Bjork | 73/304 R |
| 4,095,174 | 6/1978 | Ishido | 324/52 |
| 4,184,143 | 1/1980 | Stafford | 367/13 |
| 4,206,632 | 6/1980 | Suzuki | 340/605 |
| 4,246,575 | 1/1981 | Purtell | 340/605 |
| 4,263,115 | 4/1981 | Kessler | 204/418 |
| 4,278,931 | 7/1981 | Huggins | 324/52 |
| 4,288,653 | 9/1981 | Blom et al. | 174/47 |
| 4,288,654 | 9/1981 | Blom et al. | 174/47 |
| 4,297,686 | 10/1981 | Tom | 340/604 |
| 4,298,969 | 11/1981 | Rickenbacker | 367/13 |
| 4,305,321 | 12/1981 | Cohn | 84/1.24 |
| 4,307,606 | 12/1981 | Johnson | 73/295 |
| 4,319,078 | 3/1982 | Yokoo | 178/18 |
| 4,319,184 | 3/1982 | Kowalczyk | 333/81 R |
| 4,319,232 | 3/1982 | Westphal et al. | 340/604 |
| 4,359,721 | 11/1982 | Galvin et al. | 340/525 |
| 4,369,436 | 1/1983 | Lautenheiser | 340/510 |
| 4,386,231 | 5/1983 | Vokey | 174/115 |
| 4,400,663 | 8/1983 | May | 324/525 |
| 4,404,516 | 9/1983 | Johnson | 340/605 |
| 4,423,410 | 12/1983 | Galvin et al. | 340/525 |
| 4,424,479 | 1/1984 | Brown | 324/52 |
| 4,446,421 | 5/1984 | Berde | 324/52 |
| 4,467,286 | 8/1984 | Stitt | 333/81 R |
| 4,468,306 | 8/1984 | Freeman et al. | 204/180 |
| 4,468,607 | 8/1984 | Tanaka | 333/81 R |
| 4,503,526 | 3/1985 | Beauducel | 367/13 |
| 4,537,668 | 8/1985 | Gaussens et al. | 204/159.17 |
| 4,553,432 | 11/1985 | Barlian | 338/35 |
| 4,570,477 | 2/1986 | Sugibuchi | 174/11 R |
| 4,571,292 | 2/1986 | Liu | 204/412 |
| 4,594,638 | 1/1986 | Suzuki | 174/4 R |
| 4,677,371 | 6/1987 | Imaizumi | 174/11 R |

FOREIGN PATENT DOCUMENTS

| | | | |
|---|---|---|---|
| 899978 | 7/1949 | Fed. Rep. of Germany | 324/526 |
| 1210057 | 2/1966 | Fed. Rep. of Germany | 200/61.04 |
| 1297682 | 6/1969 | Fed. Rep. of Germany | |
| 2135214 | 2/1973 | Fed. Rep. of Germany | 333/81 R |
| 2413996 | 12/1974 | Fed. Rep. of Germany | |
| 2455007 | 5/1976 | Fed. Rep. of Germany | |
| 2517769 | 10/1976 | Fed. Rep. of Germany | |
| 2911703 | 3/1979 | Fed. Rep. of Germany | |
| 2807084 | 8/1979 | Fed. Rep. of Germany | |
| 3011500 | 10/1981 | Fed. Rep. of Germany | |
| 3225742 | 2/1983 | Fed. Rep. of Germany | |
| 3140804 | 4/1983 | Fed. Rep. of Germany | |
| 3239133 | 6/1983 | Fed. Rep. of Germany | |
| 3209560 | 9/1983 | Fed. Rep. of Germany | |
| 1260189 | 3/1961 | France | |
| 56-6133 | 1/1981 | Japan | |
| 133370 | 8/1982 | Japan | |
| 0094185 | 5/1984 | Japan | 178/18 |
| 112266 | 6/1985 | Japan | |
| 8301138 | 3/1983 | PCT Int'l Appl. | |
| 678646 | 8/1979 | U.S.S.R. | |
| 182339 | 7/1922 | United Kingdom | |
| 547461 | 8/1942 | United Kingdom | |
| 561523 | 5/1944 | United Kingdom | |
| 646392 | 11/1950 | United Kingdom | |
| 919517 | 2/1963 | United Kingdom | |
| 1178231 | 1/1970 | United Kingdom | |
| 1352124 | 5/1974 | United Kingdom | |
| 1401146 | 7/1975 | United Kingdom | |
| 1481850 | 8/1977 | United Kingdom | |
| 1550550 | 8/1979 | United Kingdom | |
| 2043974 | 10/1980 | United Kingdom | |
| 2077471 | 12/1981 | United Kingdom | |
| 2091880 | 8/1982 | United Kingdom | |

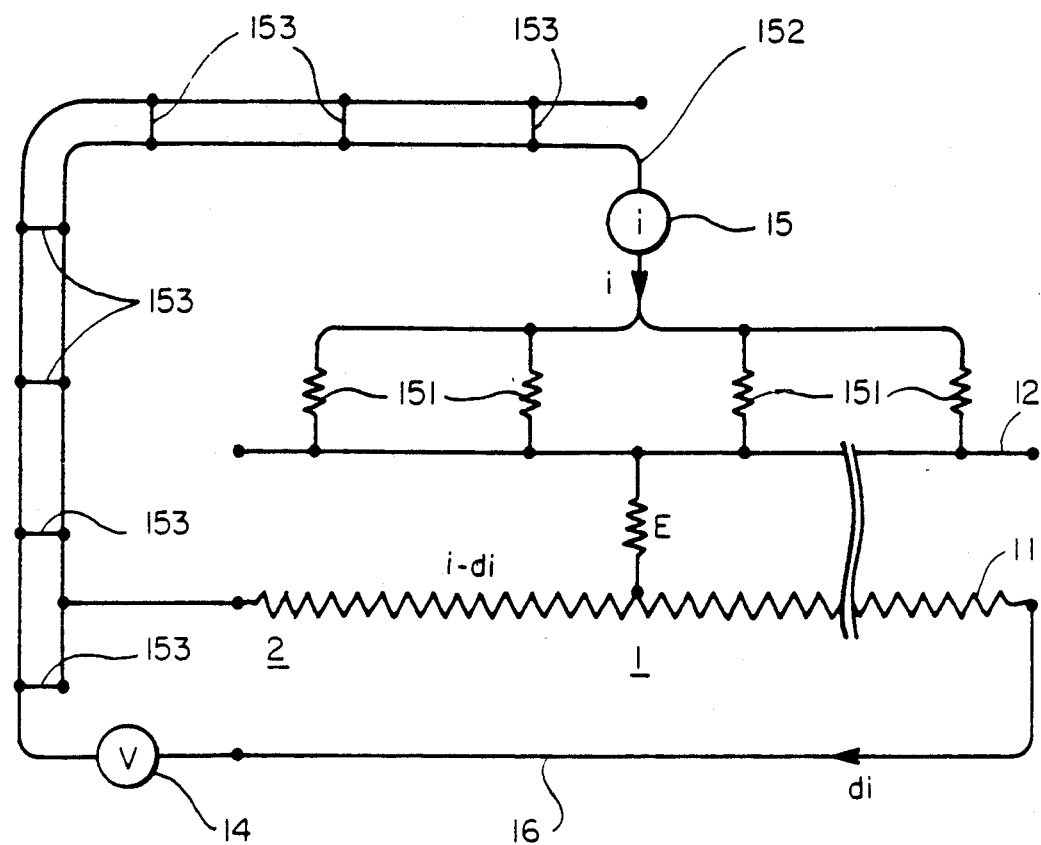
FIG_1
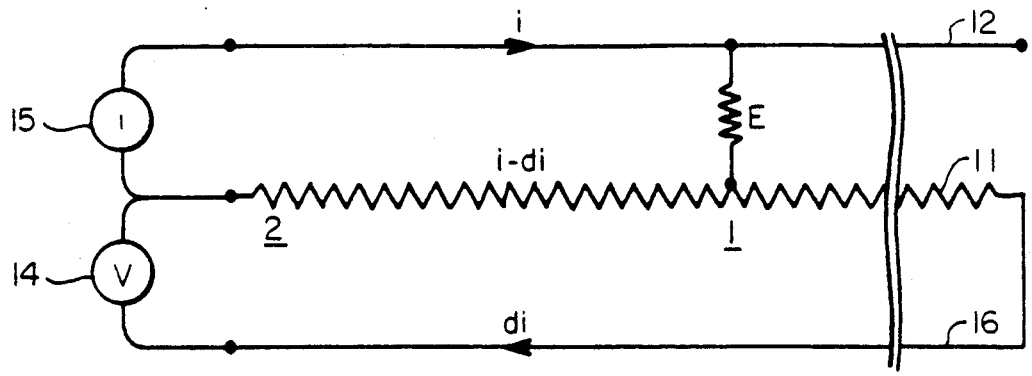
FIG_2

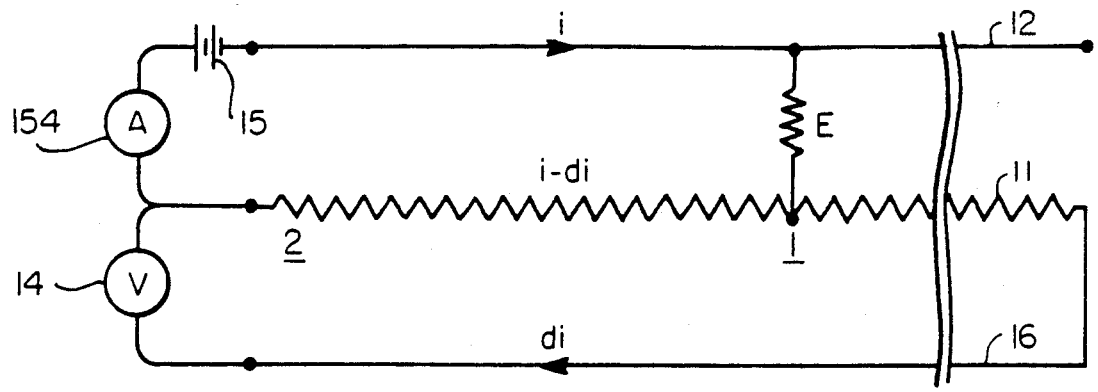
FIG_3
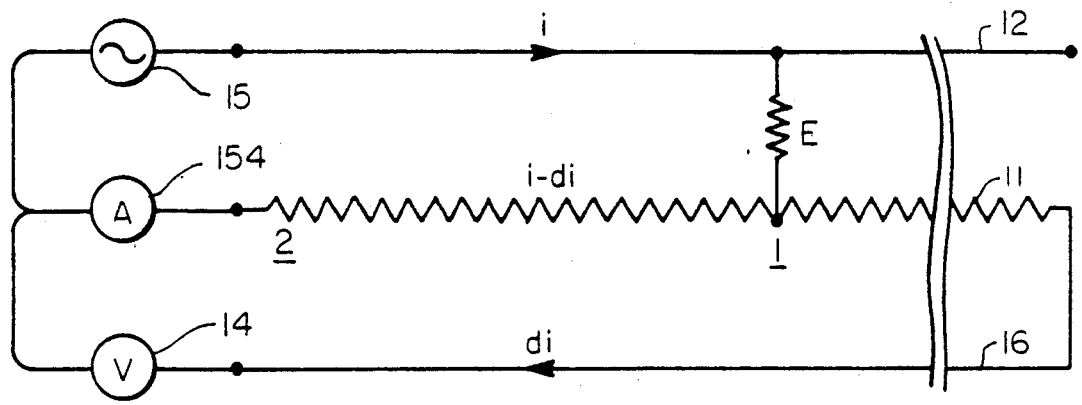
FIG_4
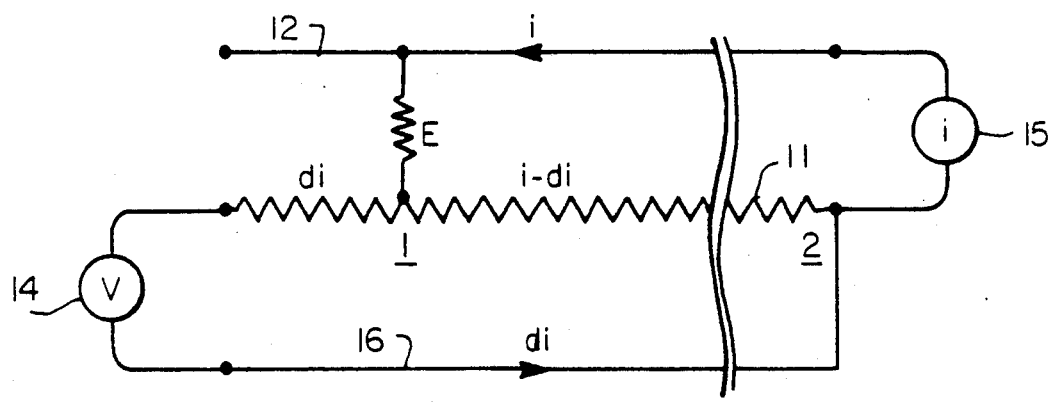
FIG_5

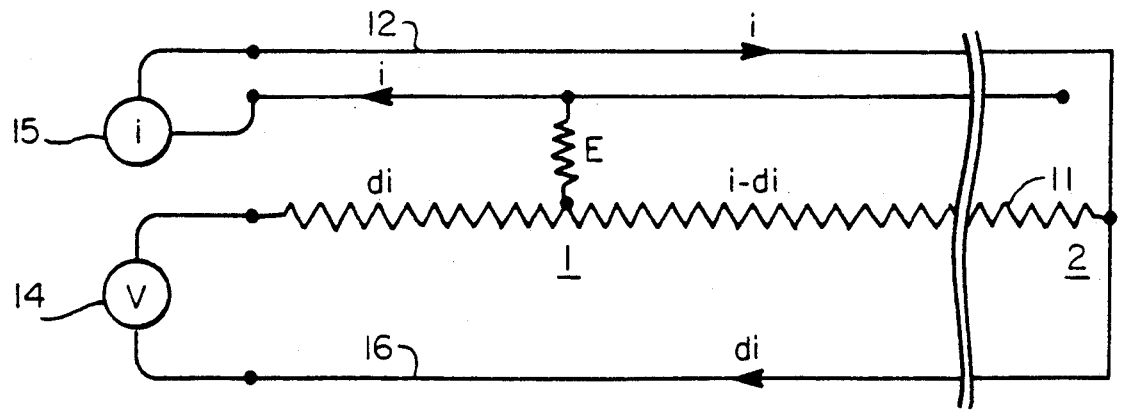
FIG_6
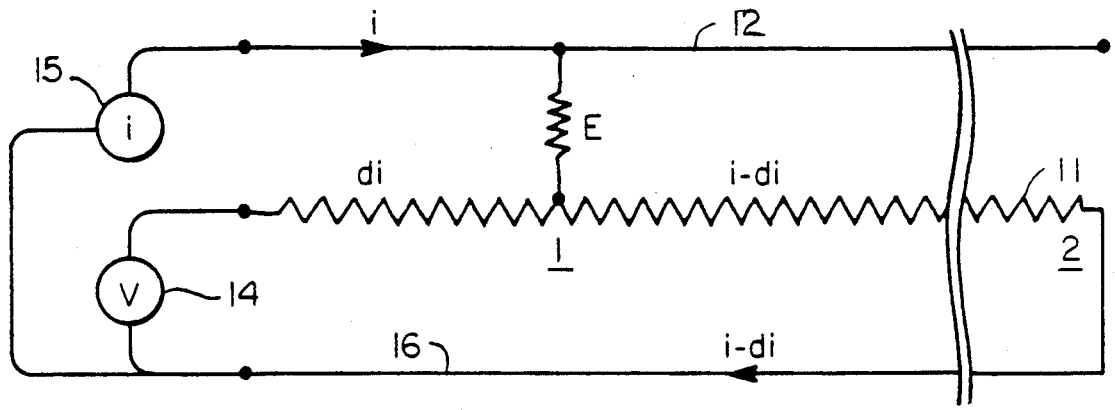
FIG_7
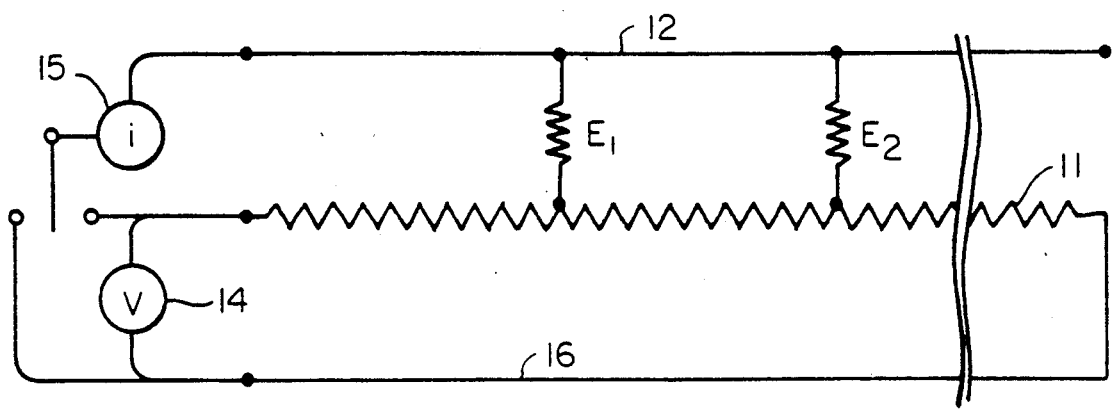
FIG_8

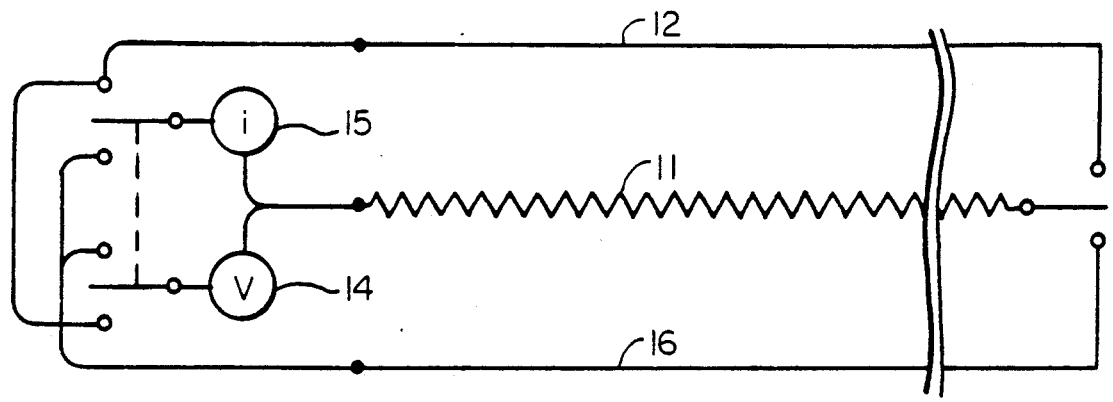
FIG_9
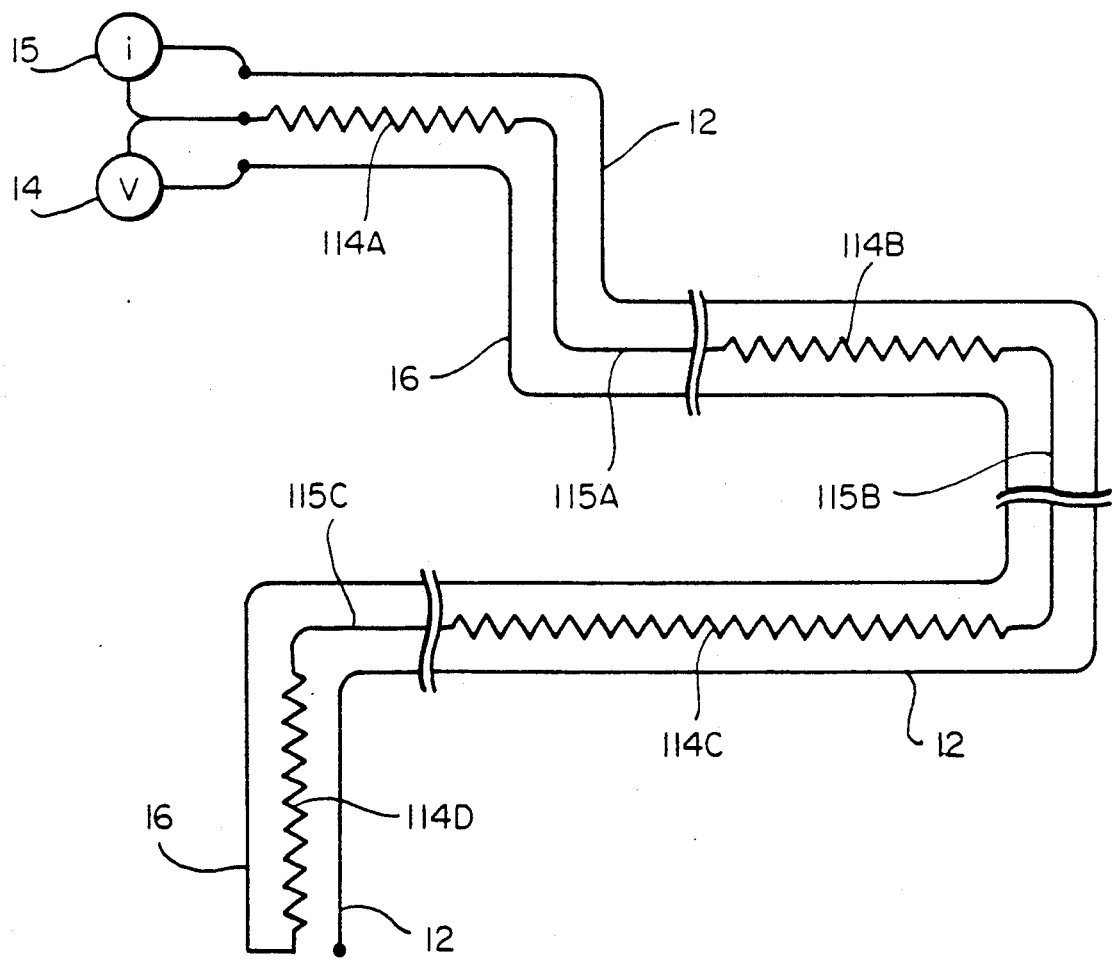
FIG_10

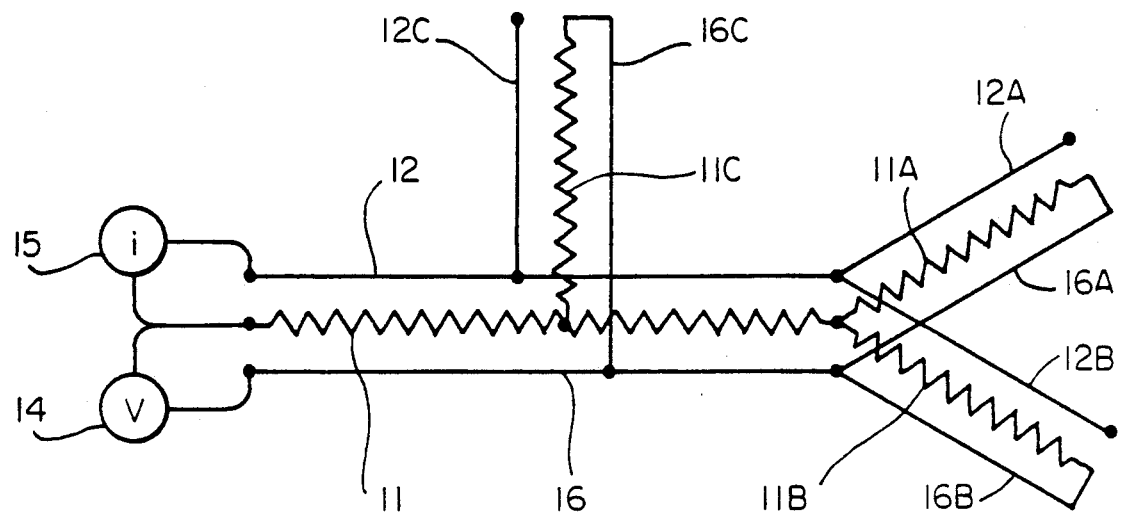
FIG_11
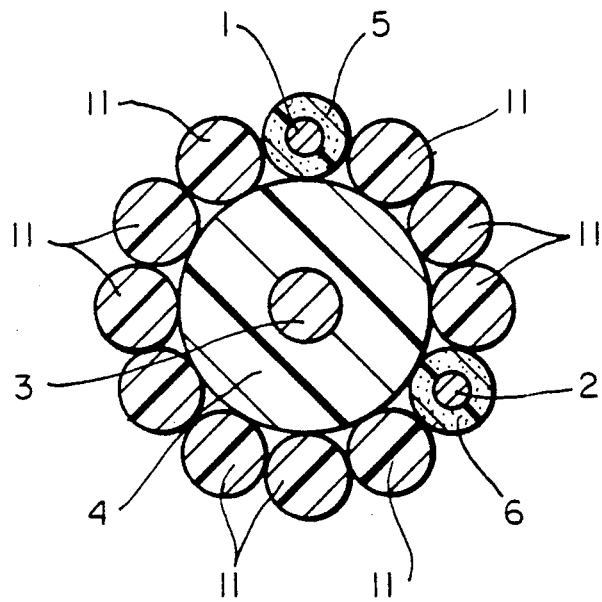
FIG_15

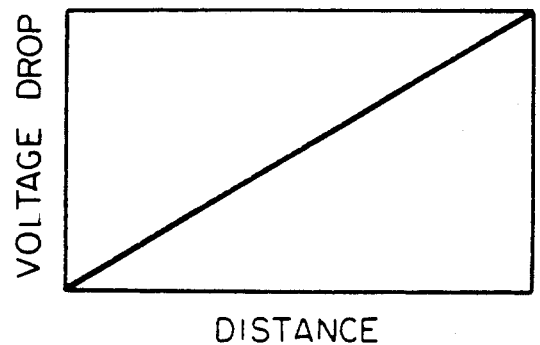
FIG_12
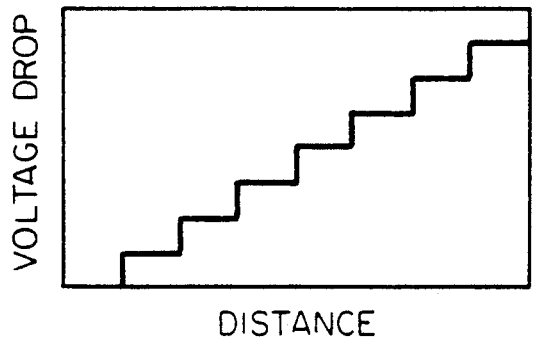
FIG_13
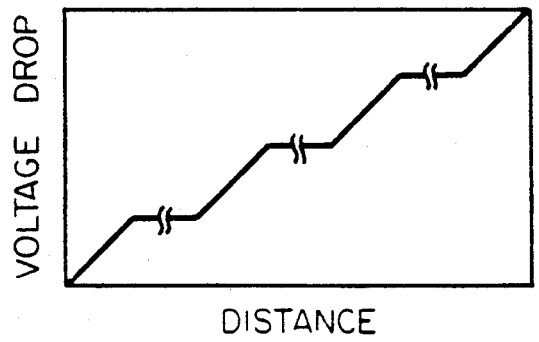
FIG_14

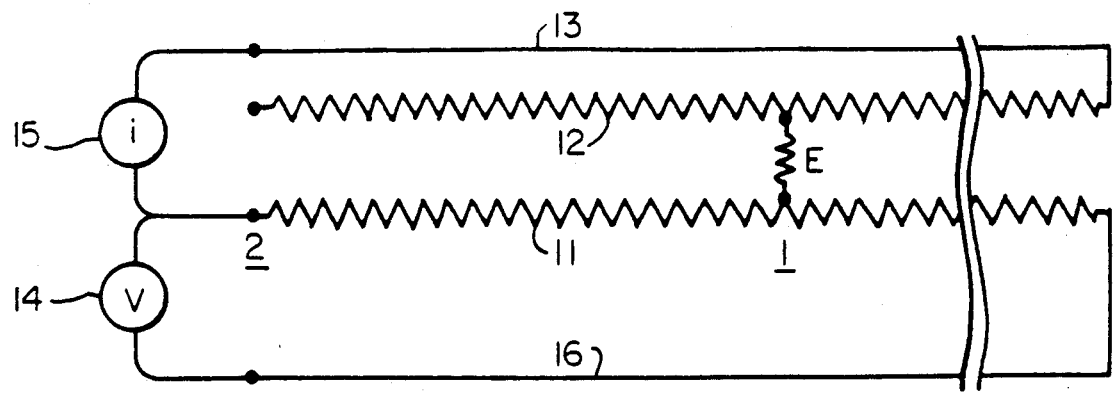
FIG_16
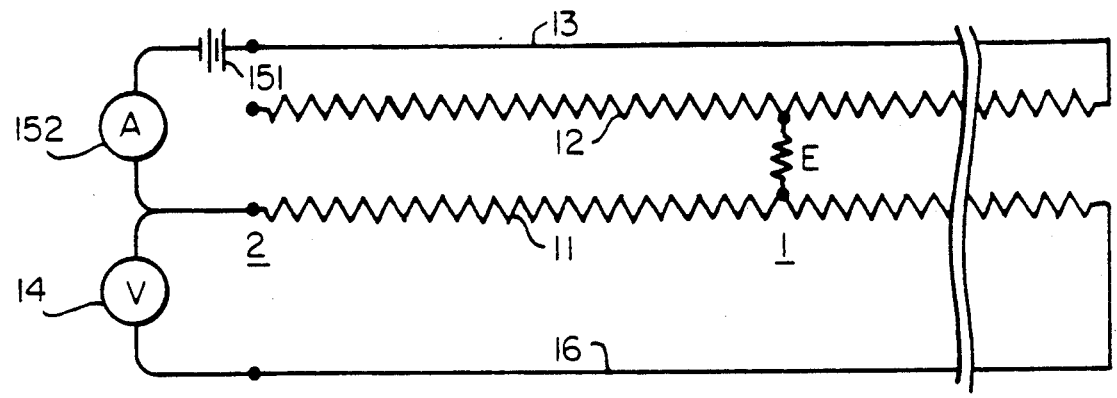
FIG_17
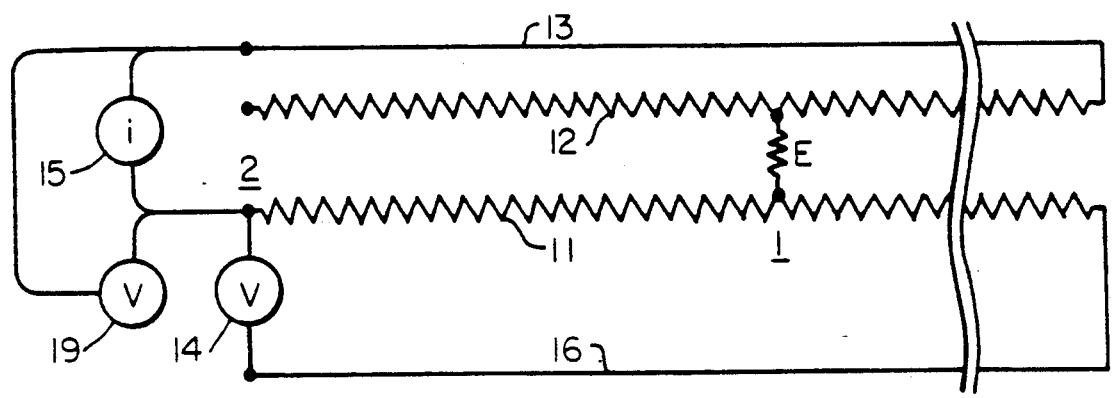
FIG_18

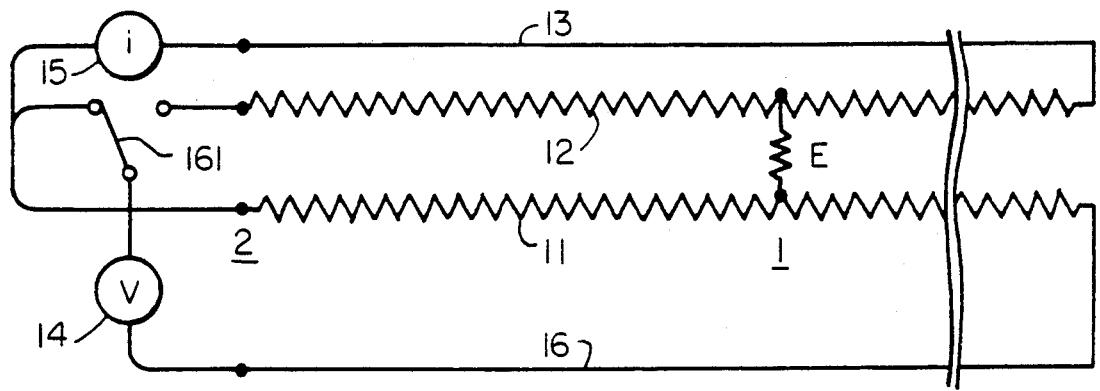
FIG_19
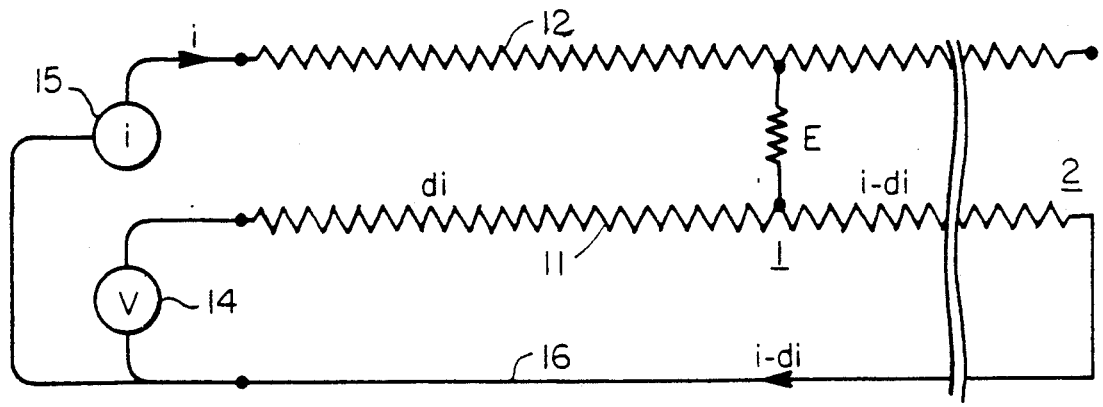
FIG_20
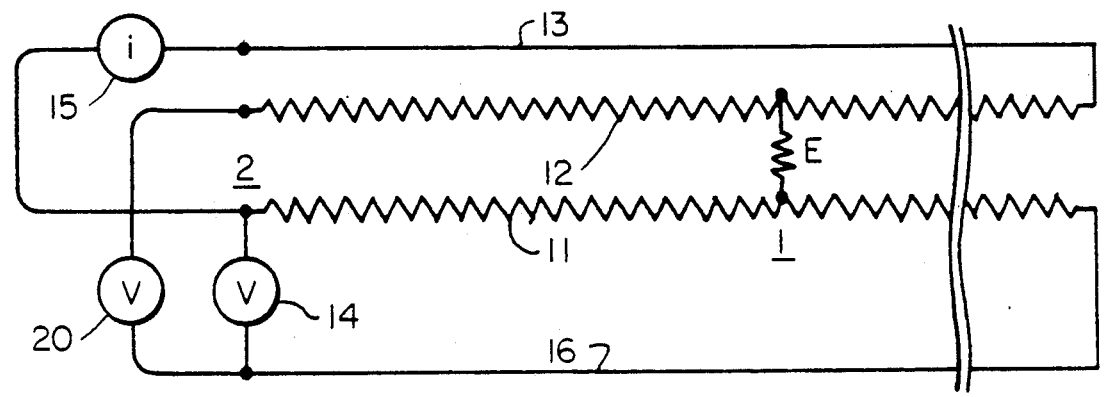
FIG_21

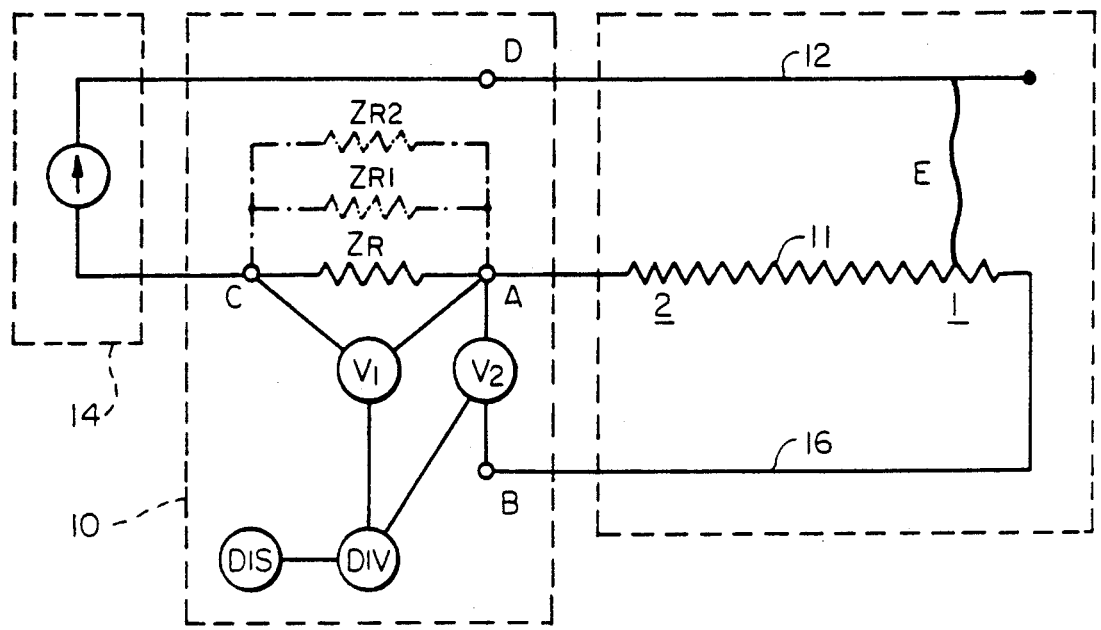
FIG_22
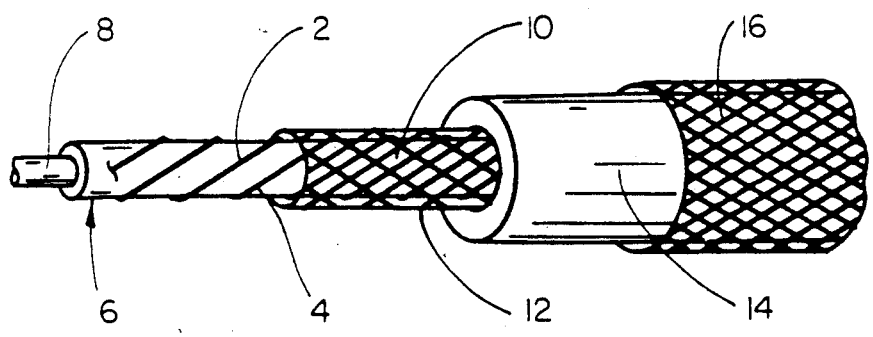
FIG_23

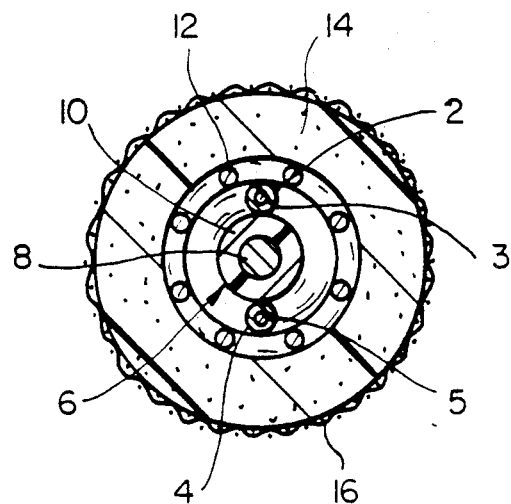
FIG_24
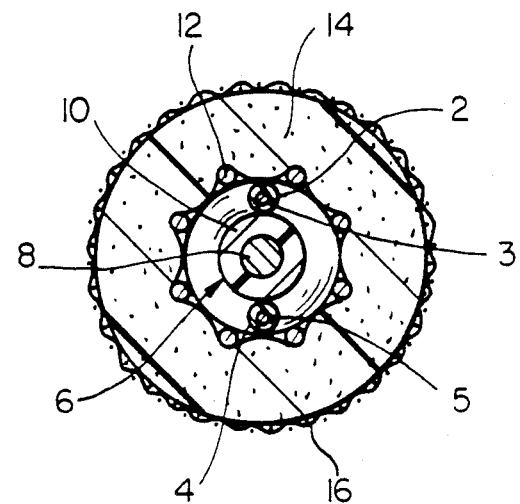
FIG_25
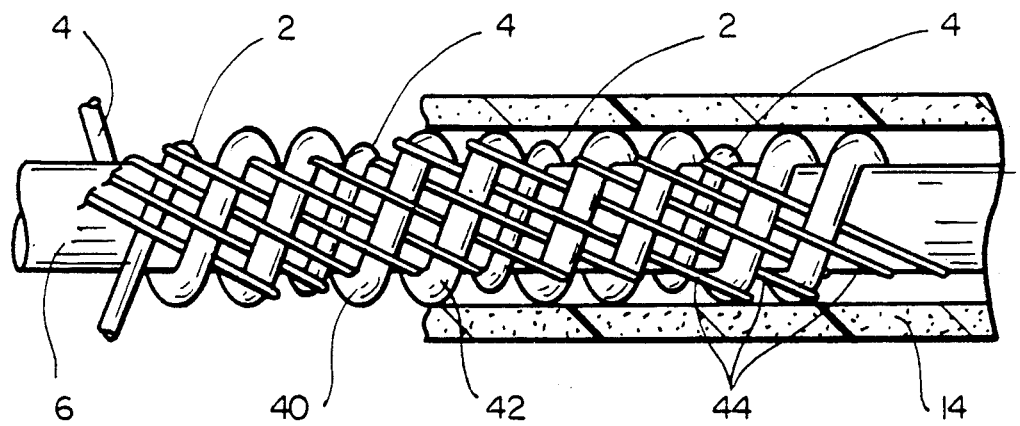
FIG_26

ELONGATE SENSORS COMPRISING CONDUCTIVE POLYMERS, AND METHODS AND APPARATUS USING SUCH SENSORS

CROSS-REFERENCE TO RELATED APPLICATIONS

This application is a file wrapper continuation of copending application ser. No. 07/306,237 filed Feb. 2, 1989 by Masia et al which is a file wrapper continuation of application Ser. No. 06/832,562 filed Feb. 20, 1986 by Masia et al, now abandoned, which is a continuation-in-part of each of the following, commonly assigned applications:

(1) U.S. Pat. Ser. No. 599,047 filed Apr. 11, 1984, by Masia and Reed, now abandoned, which is a continuation-in-part of U.S. Pat. Ser. No. 509,897, filed Jun. 30, 1983, by Masia and Reed now abandoned;

(2) U.S. Pat. Ser. No. 556,740, filed Nov. 30, 1983, by Wasley, now abandoned;

(3) U.S. Pat. Ser. No. 556,829, filed Dec. 1, 1983, which is a continuation-in-part of U.S. Pat. Ser. No. 556,740 and which is now abandoned;

(4) U.S. Pat. Ser. No. 618,109, filed Jun. 7, 1984, by Reeder, now abandoned;

(5) U.S. Pat. Ser. No. 618,108, filed Jun. 7, 1984, by Brooks and Tolles, now abandoned, which is a continuation-in-part of U.S. Pat. Ser. No. 603,485, filed Apr. 24, 1984, by Brooks and Tolles, now abandoned;

(6) U.S. Pat. Ser. No. 603,484, filed Apr. 24, 1984, by Frank and Bonomi, now abandoned;

(7) U.S. Pat. Ser. No. 744,170, filed Jun. 12, 1985, by Stewart, Lahlough and Wasley, now abandoned; and (8) U.S. Pat. Ser. NO. 787,278, filed Oct. 15, 1985, by Stewart, Lahlouh, Wasley, Hauptly and Welsh, now abandoned, which is a continuation-in-part of U.S. Pat. Ser. No. 744,170.

The disclosure of each of the pending applications referred to above is incorporated herein by reference.

BACKGROUND OF THE INVENTION

1. Field of the Invention

This invention relates to methods and apparatus for detecting and obtaining information about (particularly locating) changes in variables.

2. Introduction to the Invention

A number of methods have been used (or proposed for use) to detect changes in variables along an elongate path, e.g. the occurrence of a leak (of water or another liquid or gas), insufficient or excessive pressure, too high or too low a temperature, the presence or absence of light or another form of electro-magnetic radiation, or a change in the physical position of a movable member, e.g. a valve in a chemical process plant or a window in a building fitted with a burglar alarm system. Changes of this kind are referred to in this specification by the generic term "event". Such detection methods are for example highly desirable to detect leaks from steam lines into thermal insulation surrounding such lines, leaks from tanks and pipes containing corrosive or noxious chemicals, or leakage or condensation of water under floors or within telecommunication or electrical power systems. Some of these known methods not only signal when the event takes place, but also indicate the location of the event. However, the known methods which indicate the location of the event suffer from serious disadvantages. For example, they make use of time domain reflectometer techniques (and are, therefore, expensive), and/or give unreliable results when used over usefully long elongate paths or under conditions when there may be a substantial and unknown variation along the length of the path of a variable which effects the accuracy of the measurement (especially temperature), and/or make use of electrical conductors whose primary purpose is to carry a current (e.g. a telecommunication signal) under normal operating conditions (and which therefore have resistance and uniformity characteristics consistent with that purpose), and/or cannot be used when the event causes electrical connection between two conductors through a connection which is of high or indeterminate resistance, e.g. an ionically conductive connecting element. Reference may be made for example to U.S. Pat. Nos. 1,084,910, 2,581,213, 3,248,646, 3,384,493, 3,800,216, 3,991,413, 4,278,931 and 4,400,663, U.K. Patents Nos. 1,481,850 and 182,339 and German Offenlegungschriften Nos. 3,001,150.0 and 3,225,742. The disclosures of each of the patents, applications and other publications referred to above are incorporated herein by reference.

SUMMARY OF THE INVENTION

In accordance with the present invention, we have now discovered improved elongate sensors for monitoring for the presence of an electrolyte or an organic liquid and improved methods for using such sensors for detecting and locating such presence upon its occurrence (i.e. as soon as it occurs or at some time after it has occurred).

In its first aspect, this invention provides an elongate sensor for use in a method for detecting and locating the presence of an electrolyte, the sensor comprising (1) a first elongate electrical connection means, often simply referred to herein as the first member or the source member, which has a near end and a far end;

(2) a second elongate electrical connection means, often simply referred to herein as the second member or the locating member,
  (i) which has a near end adjacent the near end of the first connection means and a far end adjacent the far end of the first connection means,
  (ii) whose impedance, from the near end to each point thereon, is characteristic of its length from the near end to that point, and
  (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and (3) a third elongate electrical connection means, often simply referred to herein as the third member or the return member, which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;

the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration.

In its second aspect, this invention provides an elongate sensor for detecting the presence of an organic liquid at any point along its length, the sensor comprising:
 (i) an elongate support core;
 (ii) first and second elongate conductive members which, in the absence of the organic liquid to be detected, are electrically insulated from each other, and which are helically wrapped around the core;
 (iii) a separator in the form of a braid which has apertures therein and which surrounds the first and second conductive members;
 (iv) a hollow swellable member which comprises a conductive polymer, which surrounds the separator and which, when contacted by the organic liquid to be detected, swells through the apertures of the separator into contact with the first and second conductive members and bridges the conductive members, whereby an electrical path is formed between the conductive members; and
 (v) a restraining braid which surrounds the conductive polymer.

In its third aspect, this invention provides an elongate sensor for detecting the presence of an organic liquid at any point along its length, the sensor comprising
 (i) an elongate support core having a uniform cross-section along its length;
 (ii) first and second elongate conductive members which, in the absence of the organic liquid to be detected, are electrically insulated from each other, and which are helically wrapped around the core parallel to each other;
 (iii) an elongate spacer member which is helically wrapped around the core between the first and second members and which at all points projects outwardly from the core a greater distance than the first conductive member;
 (iv) an elongate third conductive member which is hollow; which surrounds the support core, the first and second conductive members and the spacer member; which, in the absence of the organic liquid to be detected, is spaced from the first conductive member by the spacer member; and which comprises a conductive polymer which, when contacted by the organic liquid to be detected, swells into contact with the first and second conductive members and bridges the first and second conductive members, whereby an electrical path is formed between the first and second conductive members.

The invention also includes methods, systems and apparatus which comprise elongate sensors (also referred to herein as cables) according to the first, second and third aspects of the invention. In particular, the invention provides, in its fourth aspect, a method for detecting and locating the presence of an electrolyte, which method comprises providing a system
(a) which comprises
 a power source;
 a voltage-measuring device; and
 an elongate sensor according to the first aspect of the invention; and
(b) in which system, when an electrolyte is present, electrical connection is made between the first member and the second member through said conductive polymer composition in said jacket(s) surrounding the first and/or the second member in the elongate sensor;
 the connection to the second member being effective at a first point whose location is defined by the location of the point or points at which the electrolyte is present;
 the making of the connection enabling the formation of a test circuit which comprises (i) that part of the second member which lies between the first point and a second point at the near end of the second member, (ii) the connection, and (iii) the power source, the power source causing an electrical current of known size to be transmitted between the first and second points on the second member; and
 the current and the second member being such that, by measuring the voltage drop between the first and second points, the spatial relationship between the first and second points can be determined;

As further explained below, particularly valuable results are obtained in this method when
(a) the second member comprises a plurality of available connection points and has an impedance $Z_{total}$ between the most widely separated available connection points, and the test circuit includes a component which (i) is connected in series with that part of the second member which lies between the first point and the second point, and (ii) has an impedance substantially equal to the difference between $Z_{total}$ and the impedance of that part of the second member which lies between the first point and the second point; and/or when
(b) in the test circuit, the power source has an output voltage V volts and causes an electrical current $I_{amps}$ of known size to be transmitted between the first and second points on the second member; and when the value of the ratio V/I is within a predetermined range, but not when said ratio is outside said predetermined range, the voltage-measuring device is used to determine the voltage drop between the first and second points.

The term "a plurality of available connection points" is used herein to include both continuous and discrete available connection points.

According to the fifth aspect of the invention, there is provided apparatus which is suitable for use in carrying out the method of the fourth aspect of the invention and which comprises
(A) an elongate sensor according to the first aspect of the invention;
(B) a voltage-measuring device for determining the voltage drop between the first point and a second point which is at the near end of the second member; and
(C) a power source which is electrically connected to the second point on the second member and, in the absence of an electrolyte, is not otherwise connected to the second member, so that, when the presence of an electrolyte causes an electrical connection to be made between the first and second members, this results in the formation of a test circuit which comprises (a) that part of the second member which lies between the first and second points, (b) the connection, and (c) the power source, and in which test circuit a current of known size is transmitted between the first and second points on the second member.

Such apparatus is particularly useful when (1) the second member comprises a plurality of available connection points and has an impedance $Z_{total}$ between the most widely separated available connection points; and (2) the first and second members are such that, when an electrical connection is made between them at any one of the available connection points, the sum of (a) the impedance of the second member between the near end and the first point and (b) the impedance of the first member between the first point and the far end is substantially equal to $Z_{total}$.

According to the sixth aspect of the invention, the elongate sensor of the first aspect of the invention is employed in a method which comprises (A) providing a system
  (a) which comprises
    a reference impedance which has a known impedance,
    a power source, and
    an elongate sensor according to the first aspect of the invention; and
  (b) in which system, when an electrolyte is present, electrical connection is made between the first and second members through said conductive polymer composition in said jacket(s) surrounding the first and/or the second member in the elongate sensor; the connection to the second member being effective at a first point whose location is defined by the location of the point or points at which the electrolyte is present; and
    the making of the connection resulting in the formation of a test circuit which comprises (i) the reference impedance and (ii) that part of the second member between the first point and a second point at the near end of the second member and in which an electrical current is transmitted between the first and second points on the second member and has a known relationship with the current through the reference impedance; and the current, the reference impedance and the second member being such that, by obtaining a ratio between a first voltage drop across the reference impedance and a second voltage drop between the first and second points on the second member, the spatial relationship between the first and second points can be determined;

(B) monitoring the system to determine when a said connection has been made;

(C) when it is determined that a said connection has been made, obtaining the ratio of the first and second voltage drops; and (D) obtaining the location of the point or points at which the electrolyte is present from the ratio in step (C).

According to the seventh aspect of the present invention, there is provided apparatus suitable for use in the method of the sixth aspect of the invention and which comprises (A) an elongate sensor according to the first aspect of the invention;

(B) a reference impedance which has a known impedance and which is connected in series with said second member;

(C) a power source which, at least when the presence of an electrolyte causes electrical connection to be made between the first and second members, causes a current to be transmitted (i) between the first point and a second point which is at the near end of the second member, and (ii) through said reference impedance, the size of the current transmitted through the reference impedance having a known relationship with the current transmitted between the first and second points;

(D) a first voltage-measuring device for determining a first voltage drop across said reference impedance.

(E) a second voltage-measuring device for determining a second voltage drop between the first and second points; and (F) a divider which provides a ratio between said first and second voltage drops.

When the presence of an electrolyte causes a single or very short connection to be made between the first (or source) member and the second (or locating) member, then the "first point" on the second member will of course be easily identified, since it is the only connection point. However, when the presence of the electrolyte results in connection at two or more spaced-apart locations and/or over a finite length of the locating member, the "first point", i.e. the point whose location can be determined from the observed voltage drop, is some intermediate point which can conveniently be referred to as the "electrical center" of the various connections. If there are connections at two or more spaced-apart locations, the "electrical center" may be at a location at which there is no connection between the locating and source members. It is for this reason that the connection to the locating member is sometimes referred herein as being "effective" at the first point. However, it is to be understood that where reference is made herein to the connection being "made" at the first point, this is intended to include situations in which a plurality of electrical connections are made between the locating member and the source member, with the electrical center of the connections being at the first point. In many cases, the first point will be at, or close to, that point at which a connection is made and which is closest to the second point; however, it is important to realize that this is not necessarily the case.

A particularly important advantage of the method of the fourth aspect of the invention is that the information obtained about the location of the electrolyte can be independent of the impedance of the connection to the second (or locating) member, i.e. the information obtained remains the same even if a substantial and unknown change is made in the impedance of the connection.

In the elongate sensors of the first aspect of the invention, assembly of at least some of the elongate connection means in a wrapped configuration, results in substantial advantages, including in particular:

(a) the ability to produce, from a limited inventory of starting materials, a range of cables of very different properties, in particular of different resolutions (which depends on the impedance per unit length of cable of the second connection means) and of different sensitivities (when this depends on the physical separation of the first and second connection means) by changes in easily adjusted manufacturing variables, e.g. the pitch of the wrapping, the separation of the wrapped components, and the means used to separate the wrapped components;

(b) the ability to produce a cable having different properties along its length by changes in easily adjusted manufacturing variables, e.g. the pitch of the wrapping;

(c) the ability to incorporate into the cable additional elongate electrical elements which can be used, for example, for continuity testing or ground fault detection;

(d) the ability to incorporate a further first electrical connection means, and/or a further second electrical connection means, so that the cable will detect changes in more than one variable;

(e) the ability to manufacture a cable having a circular cross-section, so that it is compliant in all planes and is equally sensitive in all planes to the change(s) to be detected.

The method of the fourth aspect of the invention and the apparatus of the fifth aspect of the invention, in their simplest form, suffer from the problem that they are more sensitive at the near end, adjacent to the power supply, than at the far end, since the total impedance of the test circuit varies with the location of the electrolyte. It has been discovered that this and other problems can be solved by including in the test circuit a component which (a) is connected in series with that part of the second member which is in the test circuit and (b) has an impedance equal to $(Z_{total} - Z_a)$, where $Z_{total}$ is the impedance of the whole of the second member and $Z_a$ is the impedance of that part of the second member which is in the test circuit. This can be done by including an auxiliary member which is connected to the power source and to the end of the first member which is remote from the second point or by making the third member form part of the test circuit. It is often convenient to make use of first and second members which are the same; for example each can comprise a metal core electrically surrounded by a jacket composed of a conductive polymer.

Another important advantage of a system as described above is that since the impedance of the connection(s) between the first and second members is the only variable impedance in the test circuit (or in other circuits which can be created by appropriate switching arrangements), it is possible to determine the impedance of the connection(s). This is useful, for example, in order to determine whether the impedance is changing with time.

It is also possible, in such a system, to create a system in which the test circuit will not be maintained if the impedance of the connection between the first and second members exceeds a predetermined value.

In making use of systems as described in the fourth aspect of the invention, and using a controlled current source delivering a "fixed" current, in order to detect the presence of electrolytes, it was found that false information was sometimes obtained when a very small amount of electrolyte was present, so that the first and second members were connected to each other through a connection whose resistance was so high that the "controlled current" source was no longer able to supply the expected current because its compliance voltage (i.e. the maximum voltage which the current source can provide) was insufficient to drive the "fixed" current in the test circuit. We have discovered that this and other problems can be solved by including in the system one or more components which (a) monitor the current in the test circuit, and (b) prevent the delivery of information if the current falls below the "fixed" value.

It can also be desirable, in a method of the fourth aspect of the invention including a controlled current source, to prevent the delivery of information when the impedance of the connection is within some predetermined range (e.g. above some predetermined level), even when part or all of that predetermined range is not such as to cause the current in the test circuit to fall below the "fixed" level. Under these circumstances, the information will be correct, but unwanted, and the system can advantageously be modified to include one or more components which (a) monitor the output voltage of the current source (the voltage required to deliver the "fixed" current to a particular test circuit) and (b) prevent delivery of information if the output voltage is within a predetermined range.

Similarly, when a constant voltage source is used in a method of the fourth aspect of the invention, it may be desirable to prevent the delivery of information when the impedance of the connection is within some predetermined range (e.g. above a certain level or below a certain level). Under these circumstances, too, the information will be correct, but unwanted, and in accordance with this manifestation of the present invention, the system is modified to include one or more components which (a) monitor the current in the test circuit; and (b) prevent delivery of information if the current is within a predetermined range.

The method of the sixth aspect of the present invention is a particularly advantageous embodiment of the method of the fourth aspect of the present invention, in which a reference impedance is connected in series with the locating member. When a connection is made between the source and locating members, the voltage drop down the locating member, between the first and second points, and the voltage drop across the reference impedance, are determined. A divider provides a ratio between the voltage drops and the location of the connection is determined from that ratio. A particular advantage of such systems is that variations in the size of the current do not have an adverse effect on the accuracy of the location.

The term "divider" is used herein to denote any device which obtains, from the measurements of the voltage drops, the location of the connection.

The apparatus preferably also contains a display which is activated by the divider when it provides a ratio between the first and second voltage drops.

BRIEF DESCRIPTION OF THE DRAWING

The invention is illustrated in the accompanying drawing, in which

FIG. 1 is a generalized schematic circuit diagram of the method of the fourth aspect of the present invention;

FIGS. 2–11 and 16–21 are schematic circuit diagrams which are specific examples of the generalized circuit diagram of FIG. 1;

FIGS. 12–14 are graphs showing how the voltage drop between the first and second points on the locating member can vary in different methods of the fourth aspect of the present invention;

FIG. 15 is a diagrammatic cross-section through a sensor of the first aspect of the invention;

FIG. 22 is a schematic representation of the method of the sixth aspect of the present invention;

FIGS. 23–25 are diagrammatic views of a sensor according to the second aspect of the invention; and FIGS. 26 is a diagrammatic view of a sensor according to the third aspect of the invention.

DETAILED DESCRIPTION OF THE INVENTION

In the interests of clarity, the following detailed description of the invention includes sections which are chiefly or exclusively concerned with a particular aspect of the invention. It is to be understood, however, that the relationship between different parts of the invention is of significant importance, and the following detailed description should be read in the light of that understanding. It should also be understood that, where features of the invention are described in the context of particular aspects of the invention and/or particular Figures of the drawing, the same description can also be applied to the invention in general and to the other Figures, insofar as the context permits.

The basic electrical characteristics of the elongate sensors of the first aspect of the invention, and their use in the fourth and fifth aspects of the invention, can best be understood by reference to FIG. 1. In FIG. 1, there is an elongate second (or locating) member 11, an elongate first (or source) member 12, a voltage-measuring device 14, a power source 15 and an elongate third (or return) member 16. One or both of the first or second members comprises a metal core electrically surrounded by a conductive polymer jacket. The first member is electrically connected, through the power source, to the near end of the second member; in the absence of an electrolyte, there is no other electrical connection between the first and second members. In the presence of an electrolyte at a first point 1 which lies somewhere on the locating member, but whose location is otherwise unknown, electrical connection E has been made between the locating and source members through the conductive polymer coating(s). The power source 15 is connected via connection means 152 to the near end of the locating member as designated by the numeral 2, which is the "second point" in the definitions given above. The power source is also connected to the source member; as schematically indicated by the plurality of connections 151, the connection between the power source and the source member can be made at any one or more points on the source member. Furthermore, these connections can be of any and unknown impedance, providing the power source can drive a known current between the first and second points of the locating member. Thus the making of the connection at point 1 results in the formation of a test circuit which includes the connection, the locating member between points 1 and 2, the power source and (unless a single connection 151 is made between the power source and the source member at the connection point) part of the source member.

The voltage-measuring device is connected to the near end (i.e. the second point 2) on the locating member and via the third, or return, member 16, to the far end of the locating member. Thus the voltage-measuring device forms part of a reference circuit which comprises the device, the locating member, and the return member.

The power source 15 and the voltage-measuring device 14 can be connected to the point 2 on the locating member 11 in any convenient way. Thus, as indicated by the plurality of connections 153, the connection member 152 and the return member 16 can be connected to each other at any one or more locations.

It will be seen that the location of point 1 can be calculated if the following are known:

(a) the current flowing between points 1 and 2,
(b) the impedance of the components of the reference circuit,
(c) the voltage drop measured by the voltage-measuring device,
(d) the location of point 2, and
(e) the impedance of the locating member between point 2 and each point on the locating member.

Systems in which these features are known can be provided in a number of different ways. The accuracy with which the first point can be located is limited by the ratio of the impedance of the voltage-measuring device to any unknown part of the impedance of the other components of the reference circuit, and in most cases it is convenient to use components such that the ratio of the impedance of the device to the total impedance of the rest of the reference circuit is very high. Accordingly, these ratios should preferably be at least 100, particularly at least 1,000, especially at least 10,000. It is for these reasons that the connections 153 in FIG. 1 are shown as having low resistance. By contrast, the resistance of the connection between the locating and source members, and the resistance of the other components of the test circuit, do not affect the accuracy of the information obtained; this is an important advantage of the method of the fourth aspect of the invention.

The system can be one which detects the presence of an electrolyte which lasts for only a very short time, or which is maintained for some minimum time. The system can be arranged so that it signals the presence of an electrolyte only while the electrolyte is present or so that it signals that an electrolyte has been present in the past; in the latter case, the system will normally be arranged so that it can be reset.

Each of the first, second and third members is an elongate member, this term being used to denote a member having a length which is substantially greater, e.g. at least 100 times greater, often at least 1,000 times greater, sometimes at least 10,000 times greater or even at least 100,000 times greater, than either of its other dimensions.

In many cases, it is convenient for one, two or all three of the first, second and third members to comprise simple conductors which have resistance but no reactance. These members can be the same or different. In order to reduce the input voltage required to provide a controlled current in the test circuit, the first (source) member can be less resistive than the second (locating) member. On the other hand, it is convenient, for making splices between cables at intermediate points, if the locating and source members are identical. In order to ensure that the resistance of the return member is not significant in the reference circuit, the return member can be less resistive than the locating member. In addition, the source member or the return member or both can be relatively large and strong (and, therefore, usually of low resistance, for example, less than 0.01 times the resistance of the locating member) in order that the elongate sensor comprising the three members can have good physical properties.

The second (or locating) member preferably has sufficient impedance to cause a voltage drop which is easily and accurately measured. Preferably, therefore, it has a resistance of at least 0.1 ohm/ft, particularly at least 1 ohm/ft, e.g. 1 to 5 ohm/foot. On the other hand, its resistance should preferably not be too high and is preferably less than $10^4$ ohm/foot, particularly less than $10^2$ ohm/foot, especially less than 20 ohm/foot. A key feature of the present invention is that, under the conditions of operation, the impedance of the locating member is dependent substantially only on the length thereof between the second point and the connection point. This is essential because it is not otherwise possible to calculate the location of the connection point from the change in voltage measured by the voltage-measuring device. The locating member may be of constant cross-section along its length so that its resistance per unit length is constant and the voltage change is directly proportional to the distance between the first and second points. However, this is not essential, providing that the impedance changes in a known fashion along the length of the member, so that the voltage change and the distance can be correlated. The most common variable affecting the resistivity (and, therefore, resistance) of the locating member is temperature. Many materials, and in particular copper and other metals most commonly used for electrical conductors, have a resistivity which changes with temperature to an extent which, although unimportant for many purposes, can result in unacceptable margins of error in locating the first point under conditions in which the temperature can vary substantially and unpredictably along the length of the locating member. It is preferred, therefore, that the locating member should have a temperature coefficient of impedance (usually resistance) which averages less than 0.003, particularly less than 0.0003, especially less than 0.00003, per degree Centigrade over at least one 25° temperature range between −100° C. and +500° C., and preferably over the temperature range 0° to 100° C., especially over the temperature range 0° to 200° C. For a simple metal conductor, the temperature coefficient of impedance is the same as the temperature coefficient of resistivity. The value for copper is about 0.007 per deg C. Metals having lower temperature coefficients of resistivity are well known and include Constantan (also known as Eureka), Manganin and Copel, and others listed for example in the International Critical Tables, published 1929 by McGraw-Hill Book Co., Vol. VI, pages 156-170.

It is of course important that the first, second and third members (the source, locating and return members, respectively) should be sufficiently strong, and should be assembled in such a way, that they can withstand the stresses on them during installation and use. For the return member this usually presents no problem, because it can be and preferably is securely enclosed in a conventional polymeric insulating jacket. However, the need to make electrical contact between the locating and source members in the presence of an electrolyte makes this measure impossible for them, and this can result in problems, particularly when one or more of the members is a wire of relatively small cross-section. These problems are overcome, according to the present invention, through the use of a locating member and/or a source member comprising a metal core and an elongate jacket which electrically surrounds the core and which is composed of a conductive polymer. The term "electrically surrounds" is used herein to mean that all electrical paths to the core (intermediate the ends thereof) pass through the jacket. Normally the conductive polymer will completely surround the core, being applied for example by a melt-extrusion process; however, it is also possible to make use of a jacket which has alternate insulating sections and conductive sections. The conductive polymer not only provides physical strength but also prevents corrosion of the metal core.

The term "conductive polymer" is used herein to denote a composition which comprises a polymeric component (e.g. a thermoplastic or an elastomer or a mixture of two or more such polymers) and, dispersed in the polymeric component, a particulate conductive filler (e.g. carbon black, graphite, a metal powder or two or more of these). Conductive polymers are well known and are described, together with a variety of uses for them, in for example U.S. Pat. Nos. 2,952,761, 2,978,665, 3,243,753, 3,351,882, 3,571,777, 3,757,086, 3,793,716, 3,823,217, 3,858,144, 3,861,029, 4,017,715, 4,072,848, 4,117,312, 4,177,446, 4,188,276, 4,237,441, 4,242,573, 4,246,468, 4,250,400, 4,255,698, 4,271,350, 4,272,471, 4,304,987, 4,309,596, 4,309,597, 4,314,230, 4,315,237, 4,317,027, 4,318,881 and 4,330,704; J. Applied Polymer Science 19 813-815 (1975), Klason and Kubat; Polymer Engineering and Science 18, 649-653 (1978), Narkis et al; and commonly assigned U.S. Pat. Ser. Nos. 601,424 (Moyer), now abandoned, published as German OLS 2,634,999; 750,149 (Kamath et al), now abandoned, published as German OLS No. 2,755,077; 732,792 (van Konynenburg et al), now abandoned, published as German OLS No. 2,746,602; 751,095 (Toy et al), now abandoned, published as German OLS No. 2,755,076; 798,154 (Horsma et al), now abandoned, published as German OLS No. 2,821,799; 134,354 (Lutz), now abandoned; 141,984 (Gotcher et al), now abandoned, published as European Application No. 38,718; 141,987 (Middleman et al), published as European Application No. 38,715, 141,988 (Fouts et al), now abandoned, also published as European Application No. 38,718, 141,989 (Evans), published as European Application No. 38,713, 141,991 (Fouts et al), now U.S. Pat. No. 4,545,926, published as European Application No. 38,714, 142,053 (Middleman et al), now U.S. Pat. No. 4,352,083, published as European Application No. 38,716, 150,909 (Sopory), now abandoned, and 150,910 (Sopory), now U.S. Pat. No. 4,334,351, published as UK Application No. 2,076,106A, 184,647 (Lutz), now abandoned, 250,491 (Jacobs et al), now abandoned, published as European Application No. 63,440, 273,525 (Walty), now U.S. Pat. No. 4,398,084, 274,010 (Walty et al), now abandoned, 272,854 (Stewart et al), now abandoned, published as European Application No. 67,679, 300,709 (van Konynenburg et al), now abandoned, published as European Application No. 74,281, 369,309 (Midgley et al), now abandoned, published as European Application No. 92,406, and 380,400 (Kamath), now U.S. Pat. No. 4,459,473. The disclosure of each of the patents, publications and applications referred to above is incorporated herein by reference.

The resistivity of conductive polymers usually changes with temperature at a rate well above the preferred temperature coefficient of resistivity set out above, and the PTC conductive polymers often increase in resistivity by a factor of 10 or more over a 100° C. range. Accordingly it is important that at all temperatures likely to be encountered, e.g. at all temperatures from 0° to 100° C., each longitudinal section of the conductive polymer jacket has a resistance which is at least 100 times, preferably at least 1000 times, the resistance of the core of that longitudinal section. In this way (since the core and the jacket are connected in parallel), the jacket does not make any substantial contribution to the resistance of the elongate conductor.

and any change in its resistance with temperature is unimportant.

The current which is transmitted between the first and second points of the locating member must be of known size, and is preferably supplied by a controlled current source, e.g. a galvanostat; however, a controlled voltage source can be used providing that a current-measuring device is included in the apparatus so that the location of the first point can be calculated. The current may be a direct current or an alternating current of regular sinusoidal or other form. The current which flows between the first and second points is preferably in the range of 0.05 to 100 milliamps, particularly 0.1 to 10 milliamps, e.g. 0.5 to 3 milliamps. The controlled current source is preferably a fixed current source or a current source which can be adjusted to a desired and known value, for example to obtain improved accuracy in locating a fault which was detected at a lower current level. However, it is also possible to use a fixed voltage source, in combination with a current-measuring device which measures the current flowing between the first and second points. As noted in the sixth aspect of the invention, and as further discussed below, the current can be known indirectly through measurement (including comparison) of the voltage drop over a fixed resistor through which the current also passes. The power source is preferably connected to the locating member at the second point at all times. It may, in the absence of an event, be otherwise insulated from the locating member.

The voltage-measuring device can be of any kind, and suitable devices are well known to those skilled in the art. Preferably the voltage-measuring device is a voltmeter which has a resistance of at least 10,000 ohms, preferably at least 1 megohm, especially at least 10 megohms.

As briefly indicated in the description of FIG. 1, the physical and electrical relationships between the components in the fourth and fifth aspects of the invention can be widely varied. FIGS. 2-11 show a number of different arrangements which are specific examples of the circuit generically illustrated in FIG. 1 and of various preferred embodiments of the invention. In each of FIGS. 2-11, there is a power source 15, a voltage-measuring device 14, a second (or locating) member 11, a first (or source) member 12 and a third (or return) member 16. The locating member is shown as a resistor because it must have appreciable resistance in order for the voltage drop down it to be large enough to permit accurate location of the point 1, at which the source member is connected to the locating member. The source and return members are shown as simple low resistance conductors, which they preferably are, but the source member can have high and/or indeterminate resistance (providing that the power source can drive a known current between points 1 and 2) and the return member can have substantial resistance, providing that it is a known resistance. The connections E, $E_1$ and $E_2$ are shown as resistors, since they are ionic connections of substantial resistance. In most of FIGS. 2-11, the power source is shown as a controlled current source, but in FIG. 3, the power source is a battery and the test circuit includes an ammeter 154; and in FIG. 4 the power source is a controlled voltage AC source and the test circuit again includes an ammeter 154.

Some of the different possible relationships between the components will now be enumerated, using FIGS. 2-11 as examples of these relationships.

(A) The power source can be positioned near the second point on the second (or locating) member, as illustrated in FIGS. 2-5, or near the far end of the locating member which is remote from the second point, as illustrated in FIGS. 6-7. In most cases, the power source and the voltage-measuring device are positioned near to each other as illustrated in FIGS. 2-4 and 6-9.

(B) As shown for example in FIG. 8, the apparatus can include one or more switches, which may be ganged together or may operate independently, to provide for switching the connections between the locating member and the power source from a first arrangement in which the second point is at one end of the locating member as shown in FIG. 2, to a second arrangement in which the second point is at the opposite end of the locating member, as shown in FIG. 7, thus making it possible first to measure the distance from one end that an event has taken place and then to measure the distance from the other end that an event has taken place.

Thus from FIG. 8, and also from some of the other figures, it will be clear that the designation of the "near" and "far" ends is made for the purposes of definition and does not necessarily mean (though it usually does) that the near ends are adjacent the power source and/or the voltage-measuring device.

(C) It is also possible, as shown for example in FIG. 10, when event-detection is required only in spaced-apart zones, for the locating member to comprise (a) a plurality of spaced-apart elongate locating components (114A, 114B, 114C and 114D in FIG. 10), each of which provides a series of points to which the connection can be made and preferably has a relatively high resistance per unit length, and (b) a plurality of spaced-apart elongate intermediate components (115A, 115B, and 115C in FIG. 10) which physically separate and electrically connect the locating components, which cannot become directly connected to the source member and which preferably have a relatively low resistance. This system might be used for example when detection and location was needed within each of a plurality of houses separated from each other along a street, but not between the houses.

(D) The method can also be used to locate events along a branched path, as illustrated in FIG. 11. However, when using such a branched system, if the voltage-measuring device shows an event at a distance beyond the first branching point, then there are often two or more possible locations for the fault. If desired, the location can be precisely identified by connecting the controlled current source and voltmeter to the conductors at the branch point(s) (preferably via low resistance drop leads installed at the same time as the detection system). (This expedient can also be used in unbranched systems in order to provide improved accuracy of location of the event, after the general vicinity of the event has been indicated.) Alternatively, AC current sources of different frequencies can be employed sequentially and filters can be placed in the different branches so that only one branch is being tested at any one time.

The relationship between the voltage drop measured by the voltage-measuring device and the distance between the first and second points will depend on the way in which the apparatus is designed. When connection can be made to the locating member at any point along its length, and the locating member is of uniform impedance along its length, then the relationship will be a straight line of uniform slope, as illustrated in FIG. 12. When the event-sensitive connection means is discontinuous, so that connection to the locating member is possible only at spaced-apart points, then the relationship will be a series of steps as shown in FIG. 13. When the locating member is divided into locating and connection zones and can be contacted at any point within a locating zone, as shown in FIG. 10, then the relationship is as shown in FIG. 14.

In the elongate sensors which provide the first aspect of the invention, at least one, and preferably both, of the first and second connection means comprises an elongate metal core which is electrically surrounded by a conductive polymer, and at least one, and preferably at least two, of the first, second and third connection means has a wrapped configuration. A particularly useful arrangement is for the first and second connection means to be wrapped around the third connection means, which is preferably an insulated wire. The wrapping is preferably a spiral wrap of constant pitch, but other types of wrap can be used, and the pitch can vary along the length of the cable. Wrapping is preferably effected by means of a braiding machine.

When more than one of the connection means has a wrapped configuration, the wrapped connection means are preferably parallel to each other, i.e. are wrapped in the same way and at the same pitch; they can be spaced apart from each other by a jacket composed of an insulating material (which may be apertured to permit an electrolyte to contact the connection means) on one or both of the connection means and/or by an insulating spacer which is wrapped at the same time.

As briefly noted above, the new sensor can comprise one or more first connection means and one or more second connection means, and these, and the means used to keep the first and second connection means insulated from each other in the absence of electrolyte, are chosen so that the cable will detect, and preferably distinguish between, the presence of more than an electrolyte. In addition, the cable can comprise additional elongate members which may be present simply to provide additional strength or which can be electrically conductive so that they can be used as part of a conventional system for detecting changes, e.g. for continuity testing and ground fault detection.

The new cable can be provided with an overbraid of insulating material if desired.

Referring now to FIG. 15 of the drawing, this shows a diagrammatic cross-section through an elongate sensor of the first aspect of the invention. It should be noted in particular that the distance between the center of the cable and the various elongate elements will not be constant as shown in the drawings, but will change as the elements interlace with each other, and that the various cross-over points between the elongate elements are not shown in the drawings. In FIG. 15, the first connection means comprises a metal, e.g. copper, core 1 surrounded by a conductive polymer jacket 5, and the second connection means comprises a core 2 of a metal whose resistivity is substantially invariant with temperature, e.g. Copel, surrounded by a conductive polymer jacket 6. The first and second connection means, together with elongate insulating members 11, are formed into a braid around an insulating jacket 4 which surrounds the third connection means 3 of a metal, e.g. copper. The first and second connection means are parallel to each other.

A preferred embodiment of the method which is the fourth aspect of the invention is that in which the second member comprises a plurality of available connection points and has an impedance $Z_{total}$ between the most widely separated available connection points, and the test circuit includes a component which (i) is connected in series with that part of the second member which lies between the first point and the second point, and (ii) has an impedance substantially equal to the difference between $Z_{total}$ and the impedance of that part of the second member which lies between the first point and the second point. This embodiment can most easily be understood by reference to FIGS. 16–21, though it must be realized that these Figures show only particular embodiments of the invention, and that the various features shown in the FIGS. 16–21 are also applicable to other embodiments.

FIG. 16 shows an elongate second (or locating) member 11 which has a constant resistance along its length and adjacent elongate third (or source) member 12 which is substantially identical to locating member 11. Elongate auxiliary member 13 connects the second (or far) end of the source member 12 to a constant current source 15 and thence to the first (or near) end of the locating member. An elongate return member 16 connects the near and far ends of the locating member, through a high impedance voltmeter 14. An electrolyte is present, creating connection E at point (1) on the locating member. The voltmeter 14 measures the voltage drop down the locating member between connection point (1) and the second point, which is the near end (2). The test circuit created by the connection E has an impedance which is fixed except for the impedance of connection E, and it is, therefore, possible to select precisely the limits of the impedance of the connection E which will cause the system to signal that an event has taken place.

FIG. 17 is similar to FIG. 16, but the fixed current source is replaced by a fixed voltage source 151 and an ammeter 152. Calculation of the location of the point (1) thus involves knowledge of the current through the ammeter. In this figure, the current measured by the ammeter 152 also provides a means of measuring the resistance of the connection between the source and locating members.

FIG. 18 is the same as FIG. 16 except that it also includes a second voltmeter 19 which measures the output voltage of the power source. The impedance of the connection E can be calculated from the output voltage (so long as the power source is delivering the desired "fixed" current).

FIG. 19 is somewhat similar to FIG. 16, but incorporates a switch 161 such that the return member can be connected as shown (the system then being precisely as shown in FIG. 16) or can be disconnected from the near end of the locating member and connected to the near end of the source member. In the latter configuration, the voltage measured by the voltmeter is a measure of the impedance of the connection E.

FIG. 20 shows an alternative arrangement which does not require the use of an auxiliary member, but instead makes the return member part of the test circuit, the second point then being at the far end of the system.

FIG. 21 is somewhat similar to FIG. 16, but incorporates a second voltmeter 20 which is placed so that it measures the voltage drop across the connection E, so that the impedance of the connection can then be calculated.

An important feature of this preferred embodiment is the use of a component which, in the test circuit, (a) is connected in series with that part of the location member between the first and second points and (b) has an impedance substantially equal to the difference between the total impedance of the locating member and the impedance of the locating member between the first and second points. The impedance of the component is preferably exactly equal to said difference, and this can be easily achieved by the measures described above. However, similar but less marked improvement can be obtained if the impedances are not exactly the same. Accordingly the term "substantially equal" is used herein to mean that the impedances generally differ by not more than 25%, preferably not more than 10%, particularly not more than 1% (based on the lower of the two impedances).

The impedance of the connection between the locating and source members can be measured in a number of different ways. In one method, as shown for example in FIG. 17, the power source is a fixed and known voltage source and the impedance is calculated from the current in the circuit. In another method, as shown for example in FIG. 18, the power source is a fixed and known current source and the output voltage of the power source is measured. In both cases, of course, allowance must be made for the (fixed) impedance of the remainder of the circuit.

In another method, as shown for example in FIG. 19, the power source is a fixed and known current source, and the method includes, after step (3), (4) disconnecting the voltage-measuring device and the first end of the return member from the first end of the locating member;

(5) connecting the first end of the return member to the first end of the source member, via the voltage-measuring device; and (6) determining the impedance of the connection between the locating and source members from the voltage measured by the voltage-measuring device.

In another method, as shown for example in FIG. 21, the system incorporates a second voltmeter which measures the voltage drop across the connection between the locating and source members.

A key feature of the fourth aspect of the invention is that, when the presence of an electrolyte has caused a connection to be made between the first and second members, a current of known size is driven down the locating member. When using a fixed current source, as is preferred, in a simple circuit such as that shown in FIG. 2, it must be assumed, in calculating the location of the first point, that the current driven down the locating member is the "fixed" current. However, this assumption will not be correct if the impedance of the test circuit is so high that the compliance voltage of the current source is insufficient to drive the "fixed" current, and as a result, the location of the first point will not be correct when it is calculated from the voltage drop between the first and second points. In order to ensure that false results will not be obtained, and/or to ensure that results are reported only when the presence of electrolyte produces a connection having a resistance within a specified range, a second preferred embodiment of the fourth aspect of the invention provides that when, in the test circuit, (1) the power source has an output voltage V volts and causes an electrical current $I_{amps}$ of known size to be transmitted between the first and second points on the second member, and (2) the value of the ratio V/I is within a predetermined range, but not when said ratio is outside said predetermined range, the voltage-measuring device is used to determine the voltage drop between the first and second points. The range of values for the ratio V/I within which information will be reported can easily be changed (for example so that leaks of different minimum sizes are signalled). When using a fixed current source, sensitivity can be changed by changing the compliance voltage of the source, and/or by including a known impedance in the test circuit, and/or by changing the preselected range of output voltages. When using a fixed voltage source, the size of the voltage can be changed, and/or a known impedance can be included in the test circuit, and/or the preselected current value can be changed.

As previously noted, a key feature of the fourth aspect of the invention is that, when an electrolyte is present, a current of known size is driven down the locating member. If the size of the current is to be determined or known in absolute terms, this means that the power supply must provide a current of known and unvarying magnitude or that the current must be measured before it is used in the computation that determines the location of the first point.

In the novel method which provides the sixth aspect of the present invention, the size of the current is not determined or known directly, but rather is known indirectly in terms of the voltage drop which that current (or another current which has a known relationship to that current) produces when it flows through a resistor of known size. Thus one does not need to know, in absolute terms, the size of the current, be it constant or varying, between the first and second points on the locating member. This is particularly desirable, since a constant current is difficult to realize under all operating conditions. Another advantage stems from the following: one would like to be able to use the apparatus comprising elongate locating, source and return members over path lengths that extend a considerable distance. For inherently safe systems, a voltage of not more than 24 volts is preferred, with voltages below 10 volts being particularly preferred. This results in very low currents in very long systems, in particular currents at which controlled current sources exhibit substantial variation (up to 4%) from the "fixed current". Thus the sixth aspect of the invention is of particular value when the current is below 12 millamps, e.g. 1 to 250 microamps; as a result, the elongate location and second members can now have lengths substantially greater e.g. at least 2 times greater, sometimes at least 3 times greater or even at least 5 times greater, than the length which can otherwise be used.

The sixth aspect of the invention preferably makes use of two voltage measuring devices, one measuring the first voltage drop ($V_1$) across the reference impedance, the other measuring the second voltage drop ($V_2$) down the locating member. Alternatively, a single voltage measuring device can be used together with a switch means, to measure sequentially the first and second voltage drops. The switching speed should be faster than any current size variations, so that $V_1$ and $V_2$ are measured at the same current. A divider is then used to provide a ratio between $V_1$ and $V_2$, and preferably also a display, preferably digital, for displaying the ratio obtained. Conventional dividers, switching means and displays can be used for this purpose. Preferably, the currents transmitted between the first and second points and through the reference impedance are the same, and the divider provides a ratio of the function $(Z_R V_2)/V_1$ where $Z_R$ is the magnitude of the reference impedance, and expresses the result, in some convenient units, as the distance d to a location, at which an electrolyte is present, since d is proportional to the function.

By changing the size of the reference impedance, it is easy to adjust the apparatus for changes in one or more of the following variables:

(1) the length of the locating member;
(2) the units, e.g. metric or Roman, in which the distance to the first point is displayed;
(3) the voltmeters employed and their various scale factors, bearing in mind that full scale deflection of the meter preferably corresponds to the full length of the locating member.

It is important that the reference impedance has a known, fixed value under the conditions of operation. Accordingly, the reference impedance preferably has a temperature coefficient of impedance which averages less than 0.003 per degree C. over the temperature range 0° to 100° C. The reference impedance preferably has resistance and no reactance, with typical values shown in Table I.

TABLE I

| Nominal System length (ft.) | Reference Resistance (ohms) |
|---|---|
| 2,000 | 4k |
| 20,000 | 40k |
| 200,000 | 400k |

A particular value of the reference impedance resistance is selected with an eye to the variables noted above.

For example, in the first variable listed above, different lengths of the locating member are accommodated by selecting a reference impedance resistance so that it is preferably 0.01 to 100, especially 0.1 to 10, particularly 0.5 to 2 times the resistance of the full length of the locating member. The devices can include two or more reference impedances each of known impedance, and switching means for selecting one or more of the reference impedances so that, when the device is in use, a reference impedance of the desired size is provided.

Referring now to FIG. 22, this schematically represents a preferred embodiment of the sixth aspect of the invention. A device 10 includes terminals A, B, C and D, and reference impedance $Z_R$ (which may be selected from a set of reference impedances $Z_{R1}$, $Z_{R2}$), which is connected across terminals A and C. In FIG. 22, first and second conventional voltage-measuring devices are connected across terminals A and C, and across terminals A and B respectively, and are connected to a conventional divider (DIV), in turn connected to a conventional display (DIS). The terminals D, A and B are connected to the first, second and third members, respectively, of a sensor according to the first aspect of the invention comprising first, second and third elongate members 11, 12 and 16. The terminals D and C are also connected to a power supply 14.

The second and third aspects of the present invention provide elongate sensors for detecting the presence of organic liquids which operate through the swelling of a swellable component when contacted by the organic liquid, which swelling effects electrical connection between two conductive members which, before swelling of the swellable member, are insulated from each other, to the extent that there is no electrical path between the first and second conductive members. This insulation may be achieved by providing an air gap between the conductive members, or by the use of an apertured separator, or otherwise.

In the sensors according to the third aspect of the invention, the first and second wrapped conductive members preferably have the same dimensions. Preferably at least those parts of the spacer member(s) that are in contact with the first and second conductive member(s), in use, are insulating, and especially preferably the entire spacer member is insulating. Preferably each of the spacer member and first and second conductive members has a circular cross-section, with the spacer member having a larger diameter than the first conductive member. Two or more elongate spacer members can be wrapped between the first and second conductive members, preferably in a uniform arrangement. In a particularly preferred device the device additionally comprises an insulating filler member or members. Preferably the filler members are elongate, and the first and second conductive, spacer and filler elongate members are braided together around the inner support core. Preferably the filler members are circular in cross-section and have a diameter smaller than the diameter of the elongate spacer members, especially preferably smaller than the diameter of both the spacer and the first and second conductive elongate members. Preferably the braiding is carried out so that the filler member or members does not pass between the first and second conductive members and the inner support core. This means that the first and second conductive members are always in contact with the inner support core. The inner support core is preferably cylindrical.

In one preferred embodiment, the inner surface of the hollow third conductive member is in contact with the spacer member and is therefore spaced from the inner wrapped first conductive elongate member by the larger spacer member. The separation between the first and third conductive members corresponds to the difference in the diameters of the wrapped spacer member and the wrapped, smaller first conductive member (for members of circular cross-section). In a particularly preferred embodiment, described above, elongate filler members are also included, braided with the other elongate members. The filler members pass between the elongate spacer members and the inner support core, at least at some points. Thus the maximum separation of the first and third conductive members corresponds to the difference between (1) the sum of the diameters of the filler and spacer members, and
(2) the diameter of the wrapped first conductive member.

The minimum separation between the first and third conductive members corresponds to the difference in the diameters of the elongate spacer member and the wrapped first conductive member. Preferably the elongate filler members have a small diameter relative to the other members so that the difference between the maximum and minimum separations of the conductive members is small. Typical size ranges for the components of sensors according to the third aspect of the invention are as follows:

|     |                                | Preferred Diameter Range in Mil |         |
| --- | ------------------------------ | ------------------------------- | ------- |
| (1) | Inner support core             | 73 to 83                        | esp 78  |
| (2) | Wrapped first conductive member | 27 to 37                       | esp 32  |
| (3) | Wrapped spacer member          | 30 to 55                        | esp 35  |
| (4) | Wrapped filler member          | 5 to 15                         | esp 10  |

With devices according to the third aspect of the invention, the minimum separation of the first and third conductive members is advantageously determined by the spacer. A large minimum separation is desirable to avoid accidental contact of the conductive members. If the separation is small, such accidental contact might be caused, for example, by an external pressure on the device. A small minimum separation is desirable in applications where rapid contact between the conductive members is desired in response to swelling of the swellable member. For a rapid response the minimum separation of the first and third conductive members is preferably less than 10 mils, more preferably less than 5 mils, especially preferably less than 3 mils. Thus the relative sizes of the components of the device are chosen according to the application.

When the swellable member, when swollen, must pass through the apertures of a separator, as in the second aspect of the invention, it must have a sufficiently low modulus of elasticity. Preferably the member has a modulus of elasticity in the range $5 \times 10^5$ to $5 \times 10^{10}$ dynes/cm$^2$, particularly in the range $1 \times 10^8$ to $5 \times 10^9$ dynes/cm$^2$, measured at 29° C. at a frequency of 1 Radian per second.

The devices of the second and third aspect of the invention are preferably provided in "effective lengths", that is in lengths that can be used to detect an event at any point therealong, of at least 1 foot, particularly at least 50 feet.

The swellable member must be composed of a conductive polymer which remains conductive in its swollen state. When a conductive polymer swells, the conductive particles therein become further separated and thus the resistivity of the polymer increases. Hence where a conductive polymer is used, the conductive particle loading must be carefully controlled to achieve the desired conductivity after swelling. This may be achieved by appropriate selection of the conductive filler and/or appropriate selection of the percentage of filler used. In addition the components of the sensor are preferably arranged so that the maximum total volume into which the material can swell is controlled, especially through use of a restraint member. This enables conductive polymeric materials to be used which, if allowed to swell freely would become non conductive. The resistivity of the conductive polymer before swelling is preferably in the range 0.1 to 20,000 ohm.cm, particularly 1 to 1,000 ohm.cm, especially 1 to 250 ohm.cm. The resistivity after swelling is preferably in the range 0.2 to 40,000 ohm.cm, particularly 2 to 2,000 ohm.cm, especially 2 to 500 ohm.cm.

Addition of a conductive filler to a polymer typically increases the modulus of elasticity of the polymer. Particularly where a swellable conductive polymer is to be used in combination with an apertured separator and on swelling of the swellable member is urged through that separator, this must be taken into account. In order to have both a preferred resistivity and a preferred modulus of elasticity the conductive polymer preferably contains from 5 to 35 volume % of a conductive filler, for example carbon black.

As examples of polymers that may be used in the conductive polymer, there may be mentioned styrene-butadiene-styrene block copolymers, styrene-butadiene elastomers, natural rubber, isoprene rubber and nitrile rubber. The selection of the swellable conductive polymer depends on the event to be detected. Thus where the device is to be used to detect the presence of a particular liquid, but not others, a conductive polymer must be selected which will swell in that liquid, but not in any other liquid which might also be present. The physics of liquid/polymer swelling interaction are well known, and those skilled in the art will have no difficulty, having regard to their own knowledge and the disclosure herein, in selecting an appropriate material for detection of a wide range of organic liquids.

The conductive polymer may be based on an amorphous or crystalline polymeric material or a mixture of amorphous and crystalline polymer materials. Preferably the polymeric material is lightly cross-linked. Cross-linking may be effected, for example by irradiation, for example by a beam of high energy electrons or gamma rays, or by the use of chemical cross-linking agents. Where the conductive polymer is cross-linked by irradiation, it is preferably irradiated to a beam dose of 2 to 30 Mrads, most preferably about 10 Mrads. The conductive polymer may be irradiated to the same beam dose throughout its thickness, or to a greater beam dose at its surface portions that at the intermediate portions, or in any other way. Cross-linking of the polymeric material is particularly preferred when the polymeric material used is totally amorphous.

When an apertured separator is used, it may be in any suitable form. The presence of the organic liquid is most rapidly detected where there is an aperture at the location of that presence and hence at the point of swelling. The apertures may be spaced uniformly along the device, randomly, or only at predetermined locations. The apertures may be any suitable shape. In one embodiment, the apertures are rectilinear, preferably square or diamond shaped, as for example where the separator comprises a braid. In another embodiment the apertures are slits. Thus for example the separator may comprise a slit tape that is helically wrapped in the device, or a tape that is wrapped such that there are spaces between adjacent windings. In another embodiment the apertures may be circular. For example, the separator may comprise a tube or wrapped tape, containing circular apertures. The smallest dimension of the apertures is preferably in the range 0.5 mm to 15 mm, for example about 1.5 mm. The surface area of the aperture is preferably in the range 0.25 mm$^2$ to 225 mm$^2$, for example about 2.25 mm$^2$. The depth of the apertures is preferably in the range 0.1 mm to 5 mm.

The apertured separator may be compressible, such that on swelling of the swellable member it is compressed. For example, the apertured separator may comprise a foam.

In the absence of the organic liquid to be detected, the separation of the swellable member and the first and second conductive members is preferably in the range 0.001 to 0.05 inch, preferably about 0.01 inch. If the distance is too small there is a risk that during manufacture of the device, some of the material of the conductive swellable member may pass through the apertured separator and form a bridge between the first and second conductors before swelling has taken place. If the separation is too great, swelling of the swellable member may not be sufficient to urge the swellable member through the apertured separator.

Since the event to be detected is the presence of an organic liquid, the restraining member (when used) must be is preferably permeable to that liquid, and preferably contains apertures to allow passage of the liquid through the restraining member. The restraining member may comprise, for example a braid, or another fabric construction, for example a weave or knit. Where a braid or other fabric is used as the restraining member, the fabric is preferably not so open as to allow the swellable member to pass through it, but is not so closed, and the consequent fabric tension so tight, that a conductive path is formed between the first and second conductors, during application of the restraining member during manufacture of the device.

Devices according to the second and third aspects of the invention can be used in place of the apparatus of the first aspect of the invention in methods and apparatus according to the fourth and fifth aspects of the invention.

A casing may be provided around sensors according to the second and third aspects of the invention to avoid accidental, external pressure-activated, contact of the conductive members. The casing preferably comprises a resilient or rigid material. The casing may be, for example, in the form of a helically wrapped member. The casing is permeable to the organic liquid to be detected. The casing may, for example, contain apertures or slits to allow passage of the liquid therethrough, or it may comprise a material permeable to that liquid.

The sensors of the second and third aspects of the invention may be reversible or irreversible. In reversible sensors, the swellable member is selected such that it returns towards its unswollen state when the event to be detected is removed.

Referring now to FIGS. 23 to 26, FIG. 23 shows a sensor according to the second aspect of the invention which comprises two elongate conductors 2,4 helically wrapped around a central elongate support core 6. Each conductor 2,4 comprises a central wire 3 coated with a layer of a conductive polymer 5. Support core 6 comprises an inner stranded metal wire 8 having an insulating jacket 10. The conductors 2,4 and support core 6 are surrounded by a polyvinylidenefluoride fiber separator braid 12, which is in turn surrounded by a tubular conductive polymer swellable member 14 comprising a carbon black loaded styrene-isoprene-styrene block copolymer. The swellable member 14 is in turn surrounded by a glass fibre restraining member 16. Swellable member 14 swells when exposed to hydrocarbon fluid.

FIGS. 24 and 25 show the sensor of FIG. 23 in cross-section before and after swelling of member 14 respectively. As can be seen, before swelling, separator braid 12 prevents electrical contact between conductive members 1 and 2. After swelling (FIG. 25) the swollen member 14' has urged through the separator braid 12 and contacted conductors 1 and 2. The swollen member 14' is conductive and therefore provides a conductive bridge between conductive members 1 and 2 and an electrical path therebetween. Restraining member 16 prevents the swellable member 14 swelling radially outwards.

FIG. 26 illustrates a sensor according to the third aspect of the invention which comprises (1) two elongate conductors 2, 4 that are helically wrapped around a central elongate support core 6 which comprises an inner metal wire 8 covered by an insulating jacket, (2) two insulating spacer wires 40, 42 helically wrapped around the support core 6, in the same sense as the conductors 2, 4 (3) four filler wires 44 helically wrapped around the support core in the opposite sense and (4) a tubular, swellable, conductive polymer member 14 surrounding the support core 6 and wrapped wires 2, 4, 40, 42 and 44. The spacer wires 40 have a larger diameter than conductive wires 2, 4. Thus they ensure that, in the absence of an organic liquid which swells the member 14, there is no contact between the conductive wires 2, 4 and the tubular conductive swellable member 14. When the swellable member is exposed to hydrocarbon, it swells, contacts and bridges the conductors 2, 4, forming an electrical path therebetween. The filler wires 44 are wound so that they pass over but not under conductive wires 2, 4. Thus they do not pass between the conductive wires 2, 4 and the support core 6. The filler wires 44 pass both over and under the spacer wires 40,42. Thus in the absence of a hydrocarbon, the minimum and maximum separation between the conductive members 2, 4 and the swellable member 14 are given as follows:

$$\text{Minimum Separation} = Ds - Dc$$

$$\text{Maximum Separation} = Ds - (Dc - Df)$$

Where
Ds = Diameter of spacer wire 40
Dc = Diameter of conductive wire 2, 4
Df = Diameter of filler wire 42

Sensors as shown in FIGS. 23 to 26 may be included in the circuit of FIG. 2. In that circuit, conductors 2 and 4 of FIGS. 23 to 26 provide the source and locating wires 11 and 12, and the central insulated wire 8 of support core 6 provides the return wire 16.

Sensors according to the second and third aspects of the invention are described in the following Examples.

EXAMPLE 1

Two conductive members, the first comprising a copper core surrounded by a conductive polymer jacket and the second comprising a "Copel" core surrounded by a conductive polymer jacket, together with insulating members, were formed into a braid around an insulating jacket surrounding a third copper stranded wire. An insulating jacket comprising polyvinylidenefluoride fibers was then braided thereover.

A swellable conductive polymer composition was compounded using a Banbury mixer. The composition had the following composition:

| KRATON 1107 | 58.0 weight % |
|---|---|
| CONDUCTEX 975 | 35.0 |
| SHELLFLEX 371 | 5.0 |
| TALC | 1.0 |
| IRGANOX 1010 | 0.5 |
| AGERITE RESIN D | 0.5 |
| | 100.0 |

KRATON 1107 is a styrene-isoprene-styrene block copolymer manufactured by Shell Chem. Co. with a styrene/rubber ratio of 28/72.
CONDUCTEX 975 is a high surface area carbon black with high electrical conductivity manufactured by Cities Service Company, Columbian Division.

SHELLFLEX 371 is a naphthenic oil manufactured by Shell Oil and is used as a processing aid.

TAIC is triallylisocyanurate, which is a radiation crosslinking agent.

IRGANOX 1010 are antioxidants/antidegradants/AGERITE RESIN D heat stabilizers

The swellable conductive composition was extruded over the braid-enclosed cables. The extrudate had a wall thickness in the range 50 to 60 mils, an external diameter of 0.25 inch and an internal diameter of 0.19 inch. The extruded material was beamed with a beam of high energy electrons to a dose of 10 Mrads throughout. Finally the swellable material was overbraided with a restraining braid comprising glass fiber, Fiberglass ECG 105-3/4, as supplied by Owens Corning.

The sensor prepared as described above was then connected into a circuit according to FIG. 2 which had been modified so that the resistance of the test circuit could be measured. The Copel wire provided the locating member, the wrapped copper wire the source member, and the central copper wire the return member. The device was immersed in turn in a number of different organic liquids, and the resistance in the test circuit (including the locating and source wires and the connection, when it occurs) was measured. Initially the resistance of the test circuit was infinite, since the circuit was open. The time for the resistance to fall to 20,000 ohm and further to 1,000 ohm was recorded and is shown in Table 1 below. Two tests were carried out for each liquid.

TABLE 1

| Liquid | Time to 20,000 ohm in minutes | Time to 1,000 ohm in minutes |
|---|---|---|
| JP-7 (Jet Fuel) | 8 | 11½ |
| " | 11 | 16 |
| Xylene | 3½ | 5½ |
| " | 2 | 4 |
| Methylethylketone | 7 | 15 |
| " | 8 | 19 |
| Methylene Chloride | 1 | 4½ |
| " | <½ | 1 |
| Acetone | 61 | 114 |
| " | 105 | 152 |
| Trichlorethylene | 1½ | 3 |
| " | <1 | <2 |
| Carbon Disulfide | ½ | 1½ |
| " | <½ | ½ |

EXAMPLE 2

Two sensors as shown in FIG. 26 were made. These are referred to as Devices A and B. The sizes of each of the components on devices A and B were as follows:

| | Device A in Inch | Device B in Inch |
|---|---|---|
| Diameter Support Core (6) | 0.077 | 0.060 |
| Diameter Spacer Wire (40, 42) | 0.035 | 0.049 |
| Diameter Conductor (2, 4) | 0.032 | 0.032 |
| Diameter Filler Wire (44) | 0.013 | 0.013 |
| Wall Thickness Conductive Polymer (14) | 0.050 | 0.050 |

The main difference between devices A and B is in the size of the spacer wires (40, 42).

Both devices were exposed to solvent to make the swellable member swell and the time taken for the resistance to fall to 20,000 ohm was recorded, as in Example 1. The "load to trigger" required to effect that resistance decrease was also measured. The "load to trigger" was measured by compressing the devices using an Instron machine having a crosshead displacement rate of 0.05 inch per minute. The anvil used to compress the samples had a diameter of 2.25 inches. The load to trigger was calculated per unit length of the device. Two readings were taken in each test.

| | Device A | Device B |
|---|---|---|
| Product response time in minutes to | 5.0 | 31.5 |
| reduce resistance to 20,000 ohm | 5.0 | 34.0 |
| Load to trigger in lbs. | 12.5 | 50.2 |
| per linear inch | 15.4 | 43.5 |

For device A (where the spacer wires are at least 3 mils larger than the conductor wires) the response time is more rapid, but the load to trigger lower, than for device B (where the spacer wires are at least 17 mils larger than the conductor wires). Device A is particularly suited to applications where a rapid response time is required. Device B is particularly suited to applications where the device may be subject to external pressure, and accidental response needs to be avoided.

The load to trigger of device A was increased to over 30 pounds per linear inch by helically wrapping a resilient coil around the device.

We claim:

1. An elongate sensor for use in a method for detecting and locating the presence of an electrolyte, the sensor comprising
   (1) a first elongate electrical connection means which has a near end and a far end;
   (2) a second elongate electrical connection means
      (i) which has a near end adjacent the near end of the first connection means and a far end adjacent the far end of the first connection means.
      (ii) whose impedance, from the near end to each point thereon, is characteristic of its length from the near end to that point, and
      (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and
   (3) a third elongate electrical connection means which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;

the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration.

2. A sensor according to claim 1 wherein the third electrical connection means is an insulated wire.

3. A sensor according to claim 2 wherein the first and second connection means are wrapped around the third connection means.

4. A sensor according to claim 1 wherein at least one of said first, second and third connection means forms part of a braid.

5. A sensor according to claim 4 wherein said first and second connection means form part of a braid which surrounds the third connection means.

6. A sensor according to claim 1 wherein the first and second connection means are wrapped parallel to each other.

7. A sensor according to claim 1 wherein each of the first and second connection means comprises an elongate metal core which is electrically surrounded by a jacket of a composition which comprises a polymeric component and, dispersed in the polymeric component, a sufficient amount of a particulate conductive filler to render the composition conductive at ambient temperature.

8. A sensor according to claim 7 which further comprises an electrically insulating member which is helically wrapped around the support core parallel to the first and second connection means and which lies between the first and second connection means.

9. A sensor according to claim 7 which further comprises at least one additional elongate electrical connection means which is surrounded by electrical insulation.

10. A sensor according to claim 1 wherein the second electrical connection means has a temperature coefficient of impedance which is less than 0.003 per degree Centigrade over the temperature range 0° C. to 100° C.

11. A sensor according to claim 1 which comprises an overbraid of an insulating material which surrounds the first, second and third connection means.

12. An elongate sensor for use in a method for detecting and locating the presence of an electrolyte, the sensor comprising
(1) a first elongate electrical connection means which has a near end and a far end;
(2) a second elongate electrical connection means
  (i) which has a near end adjacent the near end of the first connection means and a far end adjacent the far end of the first connection means,
  (ii) whose impedance, from the near end to each point thereon, is characteristic of its length from the near end to that point, and
  (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present;
(3) a third elongate electrical connection means which has a near end adjacent the near ends of the first and second connection means and a far end adjacent the far ends of the first and second connection means and which is an insulated wire which is electrically insulated from said first and second electrical connection means between its near end and its far end in the absence of the electrolyte and in the presence of the electrolyte; and
(4) an overbraid of an insulating material which physically secures the first, second and third connection means together;
each of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and
at least one of said first, second and third connection means having a wrapped configuration.

13. A sensor according to claim 12 wherein the first and second connection means are wrapped around the third connection means.

14. A sensor according to claim 12 wherein the first and second connection means are wrapped parallel to each other.

15. A sensor according to claim 14 which comprises an electrically insulating member which is wrapped parallel to the first and second connection means and which lies between the first and second connection means.

16. An elongate sensor for detecting the presence of an organic liquid at any point along its length, the sensor comprising:
  (i) an elongate support core;
  (ii) first and second elongate conductive members which, in the absence of the organic liquid to be detected, are electrically insulated from each other, and which are helically wrapped around the core;
  (iii) a separator in the form of a braid which has apertures therein and which surrounds the first and second conductive members;
  (iv) a hollow swellable member which comprises a conductive polymer, which surrounds the separator and which, when contacted by the organic liquid to be detected, swells through the apertures of the separator into contact with the first and second conductive members and bridges the conductive members, whereby an electrical path is formed between the conductive members; and
  (v) a restraining braid which surrounds the conductive polymer.

17. An elongate sensor for detecting the presence of an organic liquid at any point along its length, the sensor comprising
  (i) an elongate support core having a uniform cross-section along its length;
  (ii) first and second elongate conductive members which, in the absence of the organic liquid to be detected, are electrically insulated from each other, and which are helically wrapped around the core parallel to each other;
  (iii) an elongate spacer member which is helically wrapped around the core between the first and second members and which at all points projects outwardly from the core a greater distance than the first conductive member;
  (iv) an elongate third conductive member which is hollow; which surrounds the support core, the first and second conductive members and the spacer member; which, in the absence of the organic liquid to be detected, is spaced from the first conductive member by the spacer member; and which comprises a conductive polymer which, when contacted by the organic liquid to be detected, swells into contact with the first and second conductive members and bridges the first and second conductive members, whereby an electrical path is formed between the first and second conductive members.

18. A method for detecting and locating the presence of an electrolyte, which method comprises
(A) providing a system
  (a) which comprises
    a power source;
    a voltage-measuring device; and
    an elongate sensor for detecting and locating the presence of an electrolyte, the sensor comprising
    (1) a first elongate electrical connection means which has a near end and a far end;
    (2) a second elongate electrical connection means
      (i) which has a near end adjacent the near end of the first connection means and a far end adjacent the far end of the first connection means,
      (ii) whose impedance, from the near end to each point thereon, is characteristic of its length from the near end to that point, and
      (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and
    (3) a third elongate electrical connection means which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;
    the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration; and
  (b) in which system, when an electrolyte is present, electrical connection is made between the first connection means and the second connection means through said conductive polymer composition;
    the connection to the second connection means being effective at a first point whose location is defined by the location of the point or points at which the electrolyte is present;
    the making of the connection enabling the formation of a test circuit which comprises (i) that part of the second connection means which lies between the first point and a second point at the near end of the second connection means, (ii) the connection, and (iii) the power source, the power source causing an electrical current of known size to be transmitted between the first and second points on the second connection means; and
    the current and the second connection means being such that, by measuring the voltage drop between the first and second points, the spatial relationship between the first and second points can be determined;
(B) monitoring the system continuously or on a schedule to determine when a said connection has been made, said test circuit being in existence while said monitoring is taking place if a said connection has been made; and
(C) when it is determined that a said connection has been made, using the voltage-measuring device to determine the voltage drop between the first and second points; and
(D) obtaining the location of the point or points at which the electrolyte is present from the measurement made in step (C).

19. A method according to claim 18 wherein the second connection means comprises a plurality of available connection points and has an impedance $Z_{total}$ between the most widely separated available connection points, and the test circuit includes a component which (i) is connected in series with that part of the second connection means which lies between the first point and the second point, and (ii) has an impedance substantially equal to the difference between $Z_{total}$ and the impedance of that part of the second connection means which lies between the first point and the second point.

20. A method according to claim 18 wherein, in the test circuit, the power source has an output voltage V volts and causes an electrical current $I_{amps}$ of known size to be transmitted between the first and second points on the second connection means; and when the value of the ratio V/I is within a predetermined range, but not when said ratio is outside said predetermined range, the voltage-measuring device is used to determine the voltage drop between the first and second points.

21. Apparatus for detecting the presence of an electrolyte which comprises
(A) an elongate sensor for detecting and locating the presence of an electrolyte, the sensor comprising
  (1) a first elongate electrical connection means which has a near end and a far end;
  (2) a second elongate electrical connection means
    (i) which has a near end adjacent the near end of the first connection means and a far end adjacent the far end of the first connection means,
    (ii) whose impedance, from the near end to each point thereon, is characteristic of its length from the near end to that point,
    (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and
  (3) a third elongate electrical connection means which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;

the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration;

(B) a voltage-measuring device for determining the voltage drop between the first point and a second point which is at the near end of the second connection means; and (C) a power source which is electrically connected to the second point on the s means and, in the absence of an electrolyte is not otherwise connected to the second connection means, so that, when the presence of an electrolyte, causes an electrical connection to be made between the first and second connection means, this results in the formation of a test circuit which comprises (a) that part of the second connection means which lies between the first and second points, (b) the connection, and (c) the power source, and in which test circuit a current of known size is transmitted between the first and second points on the second connection means.

22. Apparatus according to claim 21 wherein
(1) the second connection means comprises a plurality of available connection points and has an impedance $Z_{total}$ between the most widely separated available connection points; and
(2) the first and second connection means are such that, when an electrical connection is made between them at any one of the available connection points, the sum of (a) the impedance of the second connection means between the near end and the first point and (b) the impedance of the first connection means between the first point and the far end is substantially equal to $Z_{total}$.

23. Apparatus according to claim 22 which comprises an additional elongate member which is connected to the far end of the first connection means and to the power source.

24. A method for detecting and locating the presence of an electrolyte, which method comprises
(A) providing a system
  (a) which comprises
    a reference impedance which has a known impedance,
    a power source, and
    an elongate sensor for detecting and locating the presence of an electrolyte, the sensor comprising
    (1) a first elongate electrical connection means which has a near end and a far end;
    (2) a second elongate electrical connection means
      (i) which has a near end adjacent the near end of the first connection means and a far end adjacent the far end of the first connection means,
      (ii) whose impedance, from the near end to each point thereon, is characteristic of its length from the near end to that point, and
      (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and
    (3) a third elongate electrical connection means which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;

the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration; and
  (b) in which system, when an electrolyte is present, electrical connection is made between the first and second connection means through said conductive polymer composition;
    the connection to the second connection means being effective at a first point whose location is defined by the location of the point or points at which the electrolyte is present; and
    the making of the connection resulting in the formation of a test circuit which comprises (i) the reference impedance and (ii) that part of the second member between the first point and a second point at the near end of the second connection means and in which an electrical current is transmitted between the first and second points on the second connection means and has a known relationship with the current through the reference impedance; and the current, the reference impedance and the second connection means being such that, by obtaining a ratio between a first voltage drop across the reference impedance and a second voltage drop between the first and second points on the second connection means, the spatial relationship between the first and second points can be determined;
(B) monitoring the system to determine when a said connection has been made;
(C) when it is determined that a said connection has been made, obtaining the ratio of the first and second voltage drops; and
(D) obtaining the location of the point or points at which the electrolyte is present from the ratio in step (C).

25. Apparatus for detecting and locating the presence of an electrolyte which comprises
(A) an elongate sensor for detecting and locating the presence of an electrolyte, the sensor comprising
   (1) a first elongate electrical connection means which has a near end and a far end;
   (2) a second elongate electrical connection means
      (i) which has a near end adjacent the near end of the first connection means and a far end adjacent the far end of the first connection means,
      (ii) whose impedance, from the near end to each point thereon, is characteristic of its length from the near end to that point, and
      (iii) which is electrically insulated from the first connection means between its near end and its far end in the absence of the electrolyte and which, in the presence of the electrolyte, becomes electrically connected to the first connection means, the connection being effective at a first point whose location is defined by the location of the point or points at which the electrolyte is present; and
   (3) a third elongate electrical connection means which has a near end adjacent the near ends of the first and second connection means and a far end adjacent the far ends of the first and second connection means and which is electrically insulated from said first and second electrical connection means between its near end and its far end in the absence of the electrolyte and in the presence of the electrolyte;
the first, second and third connection means being physically secured together; at least one of the first and second connection means comprising an elongate metal core which is electrically surrounded by a jacket of a composition which comprises a polymeric component and, dispersed in the polymeric component, a sufficient amount of a particulate conductive filler to render the composition conductive at ambient temperature; and at least one of said first, second and third connection means having a wrapped configuration; and
(B) a reference impedance which has a known impedance and which is connected in series with said second connection means;
(C) a power source which, at least when the presence of an electrolyte causes electrical connection to be made between the first and second connection means, causes a current to be transmitted (i) between the first point and a second point which is at the near end of the second connection means, and (ii) through said reference impedance, the size of the current transmitted through the reference impedance having a known relationship with the current transmitted between the first and second points;
(D) a first voltage-measuring device for determining a first voltage drop across said reference impedance,
(E) a second voltage-measuring device for determining a second voltage drop between the first and second points; and
(F) a divider which provides a ratio between said first and second voltage drops.

26. A method according to claim 18 wherein the elongate sensor comprises an overbraid of an insulating material which surrounds the first, second and third connection means.

27. A method according to claim 26 wherein the first and second connection means are wrapped parallel to each other.

28. A method according to claim 18 wherein each of the first and second connection means comprises an elongate metal core which is electrically surrounded by a jacket of a composition which comprises a polymeric component and, dispersed in the polymeric component, a sufficient amount of a particulate conductive filler to render the composition conductive at ambient temperature.

* * * * *

UNITED STATES PATENT AND TRADEMARK OFFICE
CERTIFICATE OF CORRECTION

PATENT NO. : 5,015,958

DATED : May 14, 1991

INVENTOR(S) : Masia, et. al.

It is certified that error appears in the above-indentified patent and that said Letters Patent is hereby corrected as shown below:

```
   Cover Page, Inventors [75], lines 3 to 4, delete "Paul D.
Hauptly, Fremont;".

Cover Page, Inventors [75], line 9, delete "Denis Wales,
Fremont;"
```

Signed and Sealed this

Thirtieth Day of August, 1994

*Attest:*

BRUCE LEHMAN

*Attesting Officer*     *Commissioner of Patents and Trademarks*